United States Patent
Arosio et al.

(10) Patent No.: US 12,395,070 B2
(45) Date of Patent: Aug. 19, 2025

(54) GATE DRIVER WITH SELF-ADJUSTED ADAPTIVE DEAD TIME

(71) Applicant: Infineon Technologies Austria AG, Villach (AT)

(72) Inventors: Martina Arosio, Brugherio (IT); Christian Locatelli, Pavia (IT); Eslam Ramadan Mohamed Alfawy, Villach (AT)

(73) Assignee: Infineon Technologies Austria AG, Villach (AT)

( * ) Notice: Subject to any disclaimer, the term of this patent is extended or adjusted under 35 U.S.C. 154(b) by 50 days.

(21) Appl. No.: 18/416,657

(22) Filed: Jan. 18, 2024

(65) Prior Publication Data

US 2025/0239933 A1     Jul. 24, 2025

(51) Int. Cl.
*H02M 1/38* (2007.01)
*H02M 1/088* (2006.01)
*H03K 17/687* (2006.01)
*H02P 27/08* (2006.01)

(52) U.S. Cl.
CPC .......... *H02M 1/385* (2021.05); *H02M 1/088* (2013.01); *H03K 17/6871* (2013.01); *H02P 27/08* (2013.01)

(58) Field of Classification Search
CPC .................................................... H02M 1/385
USPC ........................................................ 327/109
See application file for complete search history.

(56) References Cited

U.S. PATENT DOCUMENTS

| | | |
|---|---|---|
| 10,587,262 B1 * | 3/2020 | Morini ............. H03K 17/04206 |
| 2012/0032657 A1 | 2/2012 | Dequina |
| 2014/0368175 A1 | 12/2014 | Ryoo et al. |
| 2016/0013739 A1 | 1/2016 | Tsuchida et al. |
| 2019/0379289 A1 | 12/2019 | Xie et al. |
| 2020/0273791 A1 | 8/2020 | Templeton et al. |
| 2021/0211124 A1 | 7/2021 | Rosado et al. |

OTHER PUBLICATIONS

Lobsiger, et al., "Closed-Loop di=dt&dv=dt Control and Dead Time Minimization of IGBTs in Bridge Leg Configuration," IEEE, 2013, Power Electronic Systems Laboratory, Zurich, Switzerland.
"Enhanced LLC Controller with Adaptive Dead Time Control," Monolithic Power Systems, Inc., 2019.

* cited by examiner

*Primary Examiner* — Tomi Skibinski
(74) *Attorney, Agent, or Firm* — Harrity & Harrity, LLP

(57) ABSTRACT

A gate driver circuit includes a high-side region that operates in a first voltage domain; a low-side region that operates in a second voltage domain lower than the first voltage domain; a gate driver configured to drive a power switch between an on-state and an off-state with an adaptive dead time; a capacitor cross-coupled to the high-side region and the low-side region; a logic circuit configured to use the capacitor to detect a voltage transient of the power switch based on a first crossing of a threshold, and detect an end of the voltage transient based on a second crossing of the threshold; and an active-passive discrimination circuit configured to indicate whether the voltage transient is active or passive. The logic circuit is configured to regulate the adaptive dead time based on the second crossing of the threshold and based on the voltage transient being passive.

21 Claims, 10 Drawing Sheets

GATE DRIVER WITH SELF-ADJUSTED ADAPTIVE DEAD TIME

BACKGROUND

Many functions of modern devices in automotive, consumer, and industrial applications, such as driving an electric motor or an electric machine, rely on power semiconductor devices. For example, insulated gate bipolar transistors (IGBTs), metal oxide semiconductor field effect transistors (MOSFETs), and diodes, to name a few, have been used for various applications including, but not limited to, switches in power supplies and power converters.

A transistor typically comprises a semiconductor structure configured to conduct a load current along a load current path between two load terminal structures of the transistor. Further, the load current may be controlled by a control electrode, sometimes referred to as a gate electrode, of the transistor. For example, upon receiving a corresponding control signal from, for example, a gate driver, the control electrode may set its transistor in one of a conducting state or a blocking state. Accordingly, the semiconductor structure behaves like a switch with on and off states (i.e., conducting and blocking states, respectively).

Usually, a power inverter is composed of two complementary transistors (e.g., a high-side transistor and a low-side transistor) for each motor phase, where the two complementary transistors form a half-bridge to drive an output pad connected to a motor winding. A gate driver, used for driving the two complementary transistors, may be supplied with a fixed positive voltage by a positive supply rail and a fixed negative voltage by a negative supply rail. The positive supply rail may be connected to the output pad via the high-side transistor of the two complementary transistors to supply load current to the motor winding, and the negative supply rail may be connected to the output pad via the low-side transistor of the two complementary transistors to sink load current from the motor winding. The two complementary transistors may be complementarily turned on and off to avoid cross-conduction.

Accordingly, the load current, also referred to as a motor phase current, may be controlled by driving the two complementary transistors. The amplitude of the control signal received from the gate driver for each transistor may be varied to drive the two complementary transistors between switching states. This, in turn, drives the motor. For example, a gate-source voltage Vgs of a MOSFET is typically driven down to approximately zero to turn off the MOSFET and is typically driven to a maximum value to fully turn on the MOSFET. For this reason, the gate-source voltage Vgs may be referred to as a control voltage.

During a running operation, a motor may be driven according to a motor control algorithm to achieve a desired motor speed corresponding to an electrical frequency of the control signals.

SUMMARY

In some implementations, a gate driver circuit includes a high-side region that operates in a first voltage domain; a low-side region that operates in a second voltage domain lower than the first voltage domain; a gate driver configured to drive a power switch between an on-state and an off-state with an adaptive dead time, wherein the adaptive dead time is a delay between a turn-off event of a complementary power switch and a turn-on event of the power switch; at least one capacitor cross-coupled to the high-side region and the low-side region; a sensing circuit coupled to the at least one capacitor and configured to provide a sense value that is representative of a rate of change of a voltage present at a load terminal of the power switch; a comparator circuit configured to compare the sense value to a threshold, and further configured to generate a comparison result based on whether the sense value satisfies the threshold; a logic circuit configured to receive the comparison result, detect a voltage transient of the voltage based on the comparison result indicating a first crossing of the threshold, and detect an end of the voltage transient based on the comparison result indicating a second crossing of the threshold, wherein the second crossing occurs subsequent to the first crossing and in an opposite direction to the first crossing; and an active-passive discrimination circuit configured to detect a switching state of the power switch, including whether the power switch is in the on-state or in the off-state, wherein the active-passive discrimination circuit is configured to indicate to the logic circuit whether the voltage transient is an active voltage transient or a passive voltage transient based on the switching state of the power switch, and wherein the logic circuit is configured to regulate the adaptive dead time of the power switch based on the comparison result indicating the second crossing of the threshold and based on the voltage transient being the passive voltage transient.

In some implementations, a half-bridge gate driver circuit includes a high-side region that operates in a first voltage domain; a low-side region that operates in a second voltage domain lower than the first voltage domain; a first gate driver arranged in the high-side region and configured to drive a high-side power switch between an on-state and an off-state with a first adaptive dead time provided during an off-state interval of the high-side power switch; a second gate driver arranged in the low-side region and configured to drive a low-side power switch between the on-state and the off-state with a second adaptive dead time provided during an off-state interval of the low-side power switch, wherein the first adaptive dead time is a delay between a turn-off event of the low-side power switch and a turn-on event of the high-side power switch, wherein the second adaptive dead time is a delay between a turn-off event of the high-side power switch and a turn-on event of the low-side power switch; a phase node terminal coupled to or configured to be coupled to a phase node to which the high-side power switch and the low-side power switch are coupled; at least one capacitor cross-coupled to the high-side region and the low-side region; a first sensing circuit arranged in the high-side region, wherein the first sensing circuit is coupled to a first corresponding capacitor of the at least one capacitor, and configured to provide a first sense value representative of a rate of change of a phase voltage present at the phase node terminal; a second sensing circuit arranged in the low-side region, wherein the second sensing circuit is coupled to a second corresponding capacitor of the at least one capacitor, and configured to provide a second sense value representative of the rate of change of the phase voltage present at the phase node terminal; a first comparator circuit configured to compare the first sense value to a first threshold, and further configured to generate a first comparison result based on whether the first sense value satisfies the first threshold; a second comparator circuit configured to compare the second sense value to a second threshold, and further configured to generate a second comparison result based on whether the second sense value satisfies the second threshold; a first logic circuit configured to receive the first comparison result, detect a first voltage transient of the phase node terminal based on the first comparison result indicating a first crossing of the first threshold, and detect an end of the first voltage transient based on the first comparison result indicating a second crossing of the first threshold, wherein the second crossing of the first threshold occurs subsequent to the first crossing of the first threshold and in an opposite direction to the first crossing of the first threshold; a first active-passive discrimination circuit configured to detect a first switching state of the high-side power switch, including whether the high-side power switch is in the on-state or in the off-state, wherein the first active-passive discrimination circuit is configured to indicate to the first logic circuit whether the first voltage transient is an active voltage transient or a passive voltage transient based the first switching state of the high-side power switch, and wherein the first logic circuit is configured to regulate the first adaptive dead time of the high-side power switch based on the first comparison result indicating the second crossing of the first threshold and based on the first voltage transient being the passive voltage transient; a second logic circuit configured to receive the second comparison result, detect a second voltage transient of the phase node terminal based on the second comparison result indicating a first crossing of the second threshold, and detect an end of the second voltage transient based on the second comparison result indicating a second crossing of the second threshold, wherein the second crossing of the second threshold occurs subsequent to the first crossing of the second threshold and in an opposite direction to the first crossing of the second threshold; and a second active-passive discrimination circuit configured to detect a second switching state of the low-side power switch, including whether the low-side power switch is in the on-state or whether the low-side power switch is in the off-state, wherein the second active-passive discrimination circuit is configured to indicate to the second logic circuit whether the second voltage transient is an active voltage transient or a passive voltage transient based the second switching state of the low-side power switch, wherein the second logic circuit is configured to regulate the second adaptive dead time of the low-side power switch based on the second comparison result indicating the second crossing of the second threshold and based on second voltage transient being the passive voltage transient, and wherein the first corresponding capacitor and the second corresponding capacitor are a same capacitor or are different capacitors.

In some implementations, a method of regulating an adaptive dead time includes generating, by a gate driver of a gate driver circuit, a driving signal configured to drive a power switch between an on-state and an off-state; sensing, by a capacitor, a voltage transient of a voltage across the power switch, wherein the capacitor is cross-coupled to a high-side region and a low-side region of the gate driver circuit such that the capacitor is configured to provide a capacitor current proportional to a slope of the voltage transient; producing, at a sense node coupled to the capacitor, a sense value based on the capacitor current, wherein the sense value is proportional to the slope of the voltage transient; comparing, by a comparator circuit, the sense value to a threshold to generate a comparison result that indicates whether or not the sense value satisfies the threshold; detecting, by a logic circuit, the voltage transient based on the comparison result indicating a first crossing of the threshold; detecting, by the logic circuit, an end of the voltage transient based on the comparison result indicating a second crossing of the threshold, wherein the second crossing occurs subsequent to the first crossing and in an opposite direction to the first crossing; generating, by an active-passive discrimination circuit, a status signal indicating whether the voltage transient is an active voltage transient or a passive voltage transient based on a switching state of the power switch; and regulating, by the logic circuit, the adaptive dead time of the power switch based on the comparison result indicating the second crossing of the threshold and based on the voltage transient being the passive voltage transient.

In some implementations, a power module includes a high-side region that operates in a first voltage domain; a high-side power switch coupled to the high-side region, wherein the high-side power switch includes a first control terminal; a low-side region that operates in a second voltage domain lower than the first voltage domain; a low-side power switch coupled to the low-side region, wherein the low-side power switch includes a second control terminal; a first gate driver arranged in the high-side region and coupled to the first control terminal, wherein the first gate driver is configured to drive the high-side power switch between an on-state and an off-state with a first adaptive dead time provided during an off-state interval of the high-side power switch; a second gate driver arranged in the low-side region and coupled to the second control terminal, wherein the second gate driver is configured to drive the low-side power switch between the on-state and the off-state with a second adaptive dead time provided during an off-state interval of the low-side power switch, wherein the first adaptive dead time is a delay between a turn-off event of the low-side power switch and a turn-on event of the high-side power switch, wherein the second adaptive dead time is a delay between a turn-off event of the high-side power switch and a turn-on event of the low-side power switch; a phase node terminal coupled to or configured to be coupled to a phase node to which the high-side power switch and the low-side power switch are coupled; at least one capacitor cross-coupled to the high-side region and the low-side region; a first sensing circuit arranged in the high-side region, wherein the first sensing circuit is coupled to a first corresponding capacitor of the at least one capacitor, and configured to provide a first sense value representative of a rate of change of a phase voltage present at the phase node terminal; a second sensing circuit arranged in the low-side region, wherein the second sensing circuit is coupled to a second corresponding capacitor of the at least one capacitor, and configured to provide a second sense value representative of the rate of change of the phase voltage present at the phase node terminal; a first comparator circuit configured to compare the first sense value to a first threshold, and further configured to generate a first comparison result based on whether the first sense value satisfies the first threshold; a second comparator circuit configured to compare the second sense value to a second threshold, and further configured to generate a second comparison result based on whether the second sense value satisfies the second threshold; a first logic circuit configured to receive the first comparison result, detect a first voltage transient of the phase node terminal based on the first comparison result indicating a first crossing of the first threshold, and detect an end of the first voltage transient based on the first comparison result indicating a second crossing of the first threshold, wherein the second crossing of the first threshold occurs subsequent to the first crossing of the first threshold and in an opposite direction to the first crossing of the first threshold; a first active-passive discrimination circuit configured to detect a first switching state of the high-side power switch, including whether the high-side power switch is in the on-state or in the off-state, wherein the first active-passive discrimination circuit is configured to indicate to the first logic circuit whether the first voltage transient is an active voltage transient or a passive voltage transient based the first switching state of the high-side power switch, and wherein the first logic circuit is configured to regulate the first adaptive dead time of the high-side power switch based on the first comparison result indicating the second crossing of the first threshold and based on the first voltage transient being the passive voltage transient; a second logic circuit configured to receive the second comparison result, detect a second voltage transient of the phase node terminal based on the second comparison result indicating a first crossing of the second threshold, and detect an end of the second voltage transient based on the second comparison result indicating a second crossing of the second threshold, wherein the second crossing of the second threshold occurs subsequent to the first crossing of the second threshold and in an opposite direction to the first crossing of the second threshold; and a second active-passive discrimination circuit configured to detect a second switching state of the low-side power switch, including whether the low-side power switch is in the on-state or whether the low-side power switch is in the off-state, wherein the second active-passive discrimination circuit is configured to indicate to the second logic circuit whether the second voltage transient is an active voltage transient or a passive voltage transient based the second switching state of the low-side power switch, wherein the second logic circuit is configured to regulate the second adaptive dead time of the low-side power switch based on the second comparison result indicating the second crossing of the second threshold and based on second voltage transient being the passive voltage transient, and wherein the first corresponding capacitor and the second corresponding capacitor are a same capacitor or are different capacitors.

BRIEF DESCRIPTION OF THE DRAWINGS

Implementations are described herein making reference to the appended drawings.

DETAILED DESCRIPTION

Figure 1:
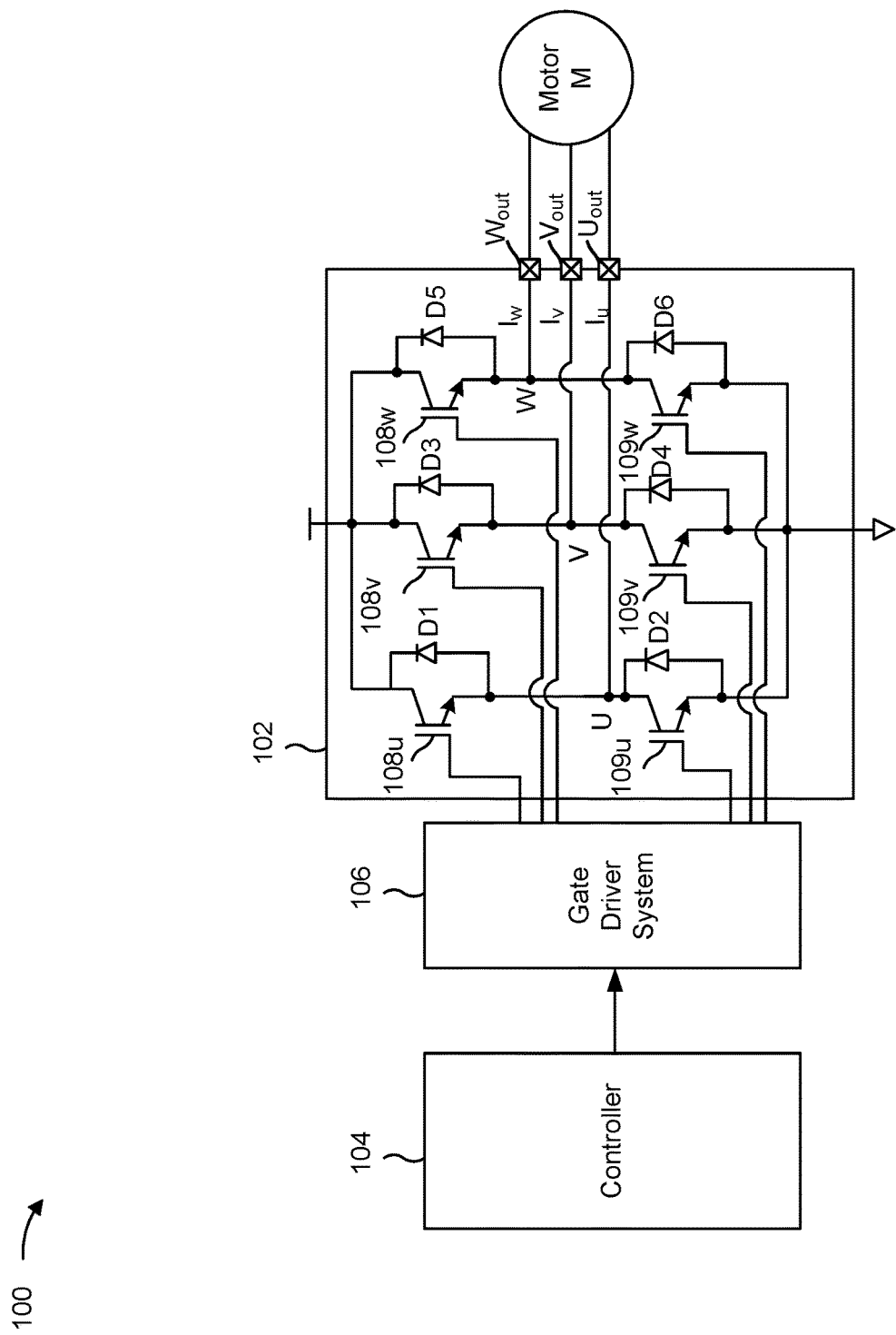
FIG. 1 illustrates a schematic block diagram illustrating a motor control system according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view, rather than in detail, in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually interchangeable.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling (e.g., any connection or coupling without additional intervening elements) may also be implemented by an indirect connection or coupling (e.g., a connection or coupling with one or more additional intervening elements, or vice versa) as long as the general purpose of the connection or coupling (e.g., to transmit a certain kind of signal or to transmit a certain kind of information) is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, a signal with an approximate signal value may practically have a signal value within 5% of the approximate signal value.

In the present disclosure, expressions including ordinal numbers, such as "first", "second", and/or the like, may modify various elements. However, such elements are not limited by such expressions. For example, such expressions do not limit the sequence and/or importance of the elements. Instead, such expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A transistor can be referred to as a power switch, a logic switch, or a transistor switch that may be used to drive a current, such as a load current. In particular, a power transistor is a power semiconductor device that may be used to drive a load current. The power transistor includes a first load terminal (e.g., a source or an emitter) and a second load terminal (e.g., a drain or a collector). Additionally, a load current path of the power transistor may be controlled by a control electrode, sometimes referred to as a gate, connected to a control terminal of the power transistor. A load current path of the power transistor is a gate-controlled conductive channel whose conductivity may be controlled by a control voltage applied to the control electrode of the power transistor. For example, the power transistor can be turned on or off by activating and deactivating its control electrode. For example, applying a positive voltage across a gate and a source of a MOSFET will keep the MOSFET in its "on" state, while applying a voltage of approximately zero or slightly negative across the gate and the source of the MOSFET will cause the MOSFET to turn "off."

There is a turn-on process and a turn-off process for switching a transistor on and off. During the turn-on process of an n-channel transistor, a gate driver may be used to provide (source) a gate current (e.g., an ON current) to a gate of the n-channel transistor in order to charge a gate voltage to a sufficient voltage to turn on the n-channel transistor. In contrast, during the turn-off process of the n-channel transistor, the gate driver is used to draw (sink) a gate current (e.g., an OFF current) from the gate of the n-channel transistor in order to discharge the gate voltage sufficiently to turn off the n-channel transistor. A voltage pulse may be output from the gate driver as a control signal according to a pulse-width modulation (PWM) scheme. Thus, the control signal may be switched between an ON voltage level and an OFF voltage level during a PWM cycle for controlling the n-channel transistor. This in turn charges and discharges gate capacitance to correspondingly modulate the gate voltage to turn on and off the n-channel transistor, respectively.

The opposite is true for a p-channel transistor. The gate driver may be used to draw (sink) a gate current (e.g., an ON current) from a gate of the p-channel transistor in order to discharge the gate voltage to a sufficient voltage to turn on the p-channel transistor. In contrast, during the turn-off process of the p-channel transistor, the gate driver is used to provide (source) a gate current (e.g., an OFF current) to the gate of the p-channel transistor in order to charge the gate voltage of the p-channel transistor sufficiently to turn off the p-channel transistor. A control signal applied to the gate of the p-channel transistor may be switched between an ON voltage level and an OFF voltage level during a PWM cycle for controlling the p-channel transistor. This in turn charges and discharges the gate voltage to turn on and off the p-channel transistor, respectively.

For both n-channel and p-channel transistors, the n-channel and p-channel transistors are off when the gate-source voltage Vgs is approximately a zero value or below a threshold voltage and the n-channel and p-channel transistors are on when the gate-source voltage Vgs is equal to or greater than the threshold voltage.

For driving a load in this manner, two transistors are typically arranged in a half-bridge configuration and may form an inverter leg of a power inverter. The two transistors may include a high-side transistor and a low-side transistor that are coupled together at a phase node at which a phase voltage (e.g., a phase node voltage) is generated based on the switching states of the two transistors. The phase voltage is used to generate a phase current. The high-side transistor may be a p-channel transistor connected to a high-side supply potential and the low-side transistor may be an n-channel transistor connected to a low-side supply potential. In some implementations, the high-side transistor and the low-side transistor may be of a same transistor type (e.g., both n-channel type or both p-channel type).

A load current (e.g., the phase current) is said to be a positive load current when the load current is flowing from a half-bridge toward the load (e.g., flowing from the phase node toward the load), and a load current is said to be negative when the load current is flowing away from the load toward the half-bridge (e.g., toward the phase node from the load). A high-side transistor, when on, is responsible for conducting a positive load current in order to source the load current to the load while its complementary, low-side transistor is turned off (e.g., the low-side transistor is in blocking or high impedance mode). In order to sink load current from the load, the roles of the high-side and low-side transistors are reversed. Here, the low-side transistor, when on, is responsible for conducting a negative load current in order to sink the load current from the load while its complementary, high-side transistor is turned off (e.g., the high-side transistor is in blocking or high impedance mode). The two complementary transistors are typically switched such that both are not turned on at the same time.

Transistors may include IGBTs and MOSFETs (e.g., Si MOSFETs or SiC MOSFETs), among other examples. It will be appreciated that one type of transistor may be substituted for another type of transistor. In this context, when substituting a MOSFET for an IGBT, the MOSFET's drain may be substituted for the IGBT's collector, the MOSFET's source may be substituted for the IGBT's emitter, the MOSFETs drain-source voltage Vds may be substituted for the IGBT's collector-emitter voltage Vce, and the MOSFET's gate-source voltage Vgs may be substituted for the IGBT's gate-emitter voltage Vge, or vice versa, in any one of the examples described herein.

Some implementations described in this disclosure pertain to, without being limited thereto, half-bridges used for driving electric motors. For example, a multi-phase inverter, as a type of power inverter, is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third of a driving cycle. Due to the phase difference, a voltage on any of the three conductors reaches its voltage peak at one third of the driving cycle, with the voltage peaks of the three conductors being distributed from each other within the driving cycle with a substantially equal phase delay. This phase delay gives constant power transfer to a balanced linear load. It also makes it possible to produce a rotating magnetic field in an electric motor.

A three-phase inverter includes three inverter legs, one for each of the three phases, and each inverter leg is connected to a direct current (DC) voltage source in parallel with the other inverter legs. Each inverter leg includes a pair of transistors arranged in a half-bridge configuration for converting DC to AC, for driving a phase load, as described above. However, multi-phase inverters are not limited to three phases, and may include two phases or more than three phases, with an inverter leg for each phase. In some instances, two half-bridges may be connected as an H-bridge circuit with the load (e.g., the motor) connected as a crossbar between the two half-bridges as a single-phase load.

A dead time is typically implemented in gate driver technologies to ensure two complementary transistors of a half-bridge circuit are not simultaneously in an on-state. Thus, the dead time is a delay between a turn-off event of one of the two complementary transistors and a turn-on event of the other one of the two complementary transistors. Reverse conduction loss caused by excessive dead time can have a dramatic influence on an efficiency of a power inverter. Wide bandgap (WBG) devices, such as silicon carbide (SiC) and gallium nitride (GaN) transistors, suffer from high reverse conduction loss and current handling capability when compared to their channel conduction. Moreover, in contrast to SiC devices with a threshold voltage of approximately 3.5 V, GaN devices exhibit a low threshold voltage of 1 V. As a result, a negative gate voltage is used to increase a resistance-to-noise (e.g., immunity to spurious power switch turn on caused by Miller capacitance injected current on the gate). However, a source-to-drain voltage (VSD) of the GaN device increases with a magnitude of the negative gate voltage, which causes the reverse conduction of the GaN device to increase. VSD is a negative drop between drain and source of a GaN transistor device. Therefore, shorter dead times may reduce reverse conduction losses which lead to system power losses and lower power efficiencies. However, dead times are typically pre-programmed and fixed, or require complex control systems.

Some implementations disclosed herein are directed to a self-adaptive dead time circuit and method that regulates (e.g., adjusts) an adaptive dead time based on evaluating a rate of change of a voltage transient dV/dt that is present at a load terminal of a power switch (e.g., a power transistor), including detecting two directionally opposed threshold crossings of the voltage transient dV/dt, and determining whether the voltage transient dV/dt is an active voltage transient or a passive voltage transient based on whether the power switch is in the off-state at the beginning of the voltage transient dV/dt. The voltage transient dV/dt may correspond to a voltage across the power switch or a voltage (e.g., a phase voltage) at a phase node terminal. For example, the voltage transient dV/dt may be a drain-source voltage $V_{DS}$ transient of the power switch. Voltage transient dV/dt measurements may be obtained and compared with the threshold to detect the two threshold crossings. Thus, the self-adaptive dead time circuit may include dV/dt sensing that is used to quickly detect threshold crossings. The self-adaptive dead time circuit may enable a low-cost design. As a result, the self-adaptive dead time circuit may regulate the adaptive dead time within a same switching cycle as the voltage transient dV/dt to provide an optimized (e.g., a shortest) dead time that minimizes reverse conduction losses. In addition, the self-adaptive dead time circuit may perform an evaluation for each switching cycle and perform the regulation of the adaptive dead time for each switching cycle. Thus, each dead time interval of a switching scheme can be optimized.

FIG. 1 illustrates a schematic block diagram illustrating a motor control system 100 according to one or more implementations. In particular, the motor control system 100 includes a power inverter 102, a controller 104, and a gate driver system 106. The controller 104 and the gate driver system 106 may operate together as a motor control unit. In some implementations, the motor control unit may be a monolithic integrated circuit (IC) with the controller 104 and the gate driver system 106 being arranged on a single IC. "Monolithic" refers to a type of IC or semiconductor device that is fabricated on a single chip of a single material, typically silicon. The IC is called "monolithic" because all the active and passive components of the circuit, such as transistors, resistors, capacitors, and interconnects, are integrated onto a single piece or substrate of material. In some implementations, the motor control unit may be divided into two or more ICs, for example, with the controller 104 being arranged on a first IC and the gate driver system 106 being arranged on one or more second ICs. Thus, the gate driver system 106 may be a monolithic gate driver. It will be appreciated that, while implementations described herein are directed to driving a motor, the concepts described herein may be extended to other types of inductive loads and are not limited to motors.

The motor control system 100 is further coupled to a motor M (e.g., a permanent magnet synchronous motor (PMSM) as a type of AC motor), that includes three phases U, V, and W. The power inverter 102 in this example is a three-phase voltage generator configured to provide three-phase power by supplying three phase voltages to drive the motor M.

Deviations in both magnitude and phase may cause a loss in power and torque in the motor M. Therefore, the controller 104 may be configured to monitor and control the magnitude and phase of the voltages supplied to the motor M in real-time to ensure that the proper current balance is maintained based on a feedback control loop.

The power inverter 102 for the motor M includes a switching array of six transistors 108u, 108v, 108w, 109u, 109v, and 109w arranged in complementary pairs. Each complementary pair forms a half-bridge circuit and constitutes one inverter leg that supplies a phase voltage to the motor M. Thus, each inverter leg includes a high-side transistor 108u, 108v, or 108w and a low-side transistor 109u, 109v, or 109w. Additionally, each transistor 108u, 108v, 108w, 109u, 109v, and 109w may be connected antiparallel to a corresponding freewheeling diode D1-D6. The freewheeling diodes D1-D6 provide an alternative current path for the load current during turn off of a respective transistor 108u, 108v, 108w, 109u, 109v, and 109w for current commutation. For example, the freewheeling diode D1 provides an alternative current path with respect to the low-side transistor 109u during the turn off of the low-side transistor 109u. Similarly, the freewheeling diode D2 provides an alternative current path with respect to the high-side transistor 108u during the turn off of the high-side transistor 108u.

Load current paths U, V, and W extend from an output pad Uout, Vout, or Wout of each inverter leg (e.g., the output of each half-bridge circuit) located between complementary transistors and are configured to be coupled to a load, such as the motor M. Each load current path U, V, and W carries a corresponding phase current Iu, Iv, and Iw. Each phase current Iu, Iv, and Iw has an AC electrical frequency that directly corresponds to the actual motor speed of the motor M.

The power inverter 102 is coupled to a DC power supply (e.g., a battery or a diode bridge rectifier) and to the gate driver system 106.

The controller 104, which may be a microcontroller or another hardware-based controller, performs a motor control function of the motor control system 100 in real-time (or near real-time) and transmits PWM control signals to a gate driver system 106. The controller 104 may employ a PWM scheme for controlling the state of each transistor, and, ultimately, each phase current provided on the respective load current paths U, V, and W. The gate driver system 106 generates driver signals based on the PWM control signals for controlling the switching states (e.g., on and off states) of the transistors 108u, 108v, 108w, 109u, 109v, and 109w. Thus, load current paths U, V, and W may be controlled by the controller 104 and the gate driver system 106 by controlling the control electrodes (e.g., gate electrodes) of the transistors 108u, 108v, 108w, 109u, 109v, and 109w. For example, upon receiving a PWM control signal from the controller 104, the gate driver system 106 may set a corresponding transistor 108u, 108v, 108w, 109u, 109v, or 109w in one of a conducting state (e.g., on-state) or a blocking state (e.g., off-state).

The gate driver system 106 may include one or more gate drivers for driving the transistors 108u, 108v, 108w, 109u, 109v, and 109w between switching states. For example, the gate driver system 106 may include a gate driver for each half-bridge circuit. The gate driver system 106 may be configured to receive instructions, including the PWM control signals, from the controller 104, and respectively turn on and turn off the transistors 108u, 108v, 108w, 109u, 109v, and 109w in accordance with the received instructions and the control signals. For example, during the turn-on process of a transistor 108u, 108v, 108w, 109u, 109v, or 109w, the gate driver system 106 may be used to provide (source) a gate current to a gate of the transistor 108u, 108v, 108w, 109u, 109v, or 109w to charge the gate. In contrast, during the turn-off process, the gate driver system 106 may be used to draw (sink) a gate current from the gate of the transistor 108u, 108v, 108w, 109u, 109v, or 109w to discharge the gate.

Furthermore, the transistors 108u, 108v, 108w, 109u, 109v, and 109w of the power inverter 102 are controlled so that at no time are both high-side and low-side transistors in the same inverter leg turned on, or else the DC power supply would be shorted. This requirement may be met by the complementary operation of the transistors 108u, 108v, 108w, 109u, 109v, and 109w within an inverter leg according to a motor control algorithm. For example, during operation, the motor M may be driven according to the motor control algorithm to achieve a desired motor speed corresponding to an electrical frequency of the control signals. A dead time may be imposed by the controller 104 during which both the high-side and low-side transistors of the same inverter leg are simultaneously turned off.

As indicated above, FIG. 1 is provided merely as an example. Other examples may differ from what is described with regard to FIG. 1. For example, in some implementations, a number of motor phases may be different or two half-bridges may be connected as an H-bridge circuit. In some implementations, additional circuit components may be added without deviating from the disclosure provided above.

Figure 2:
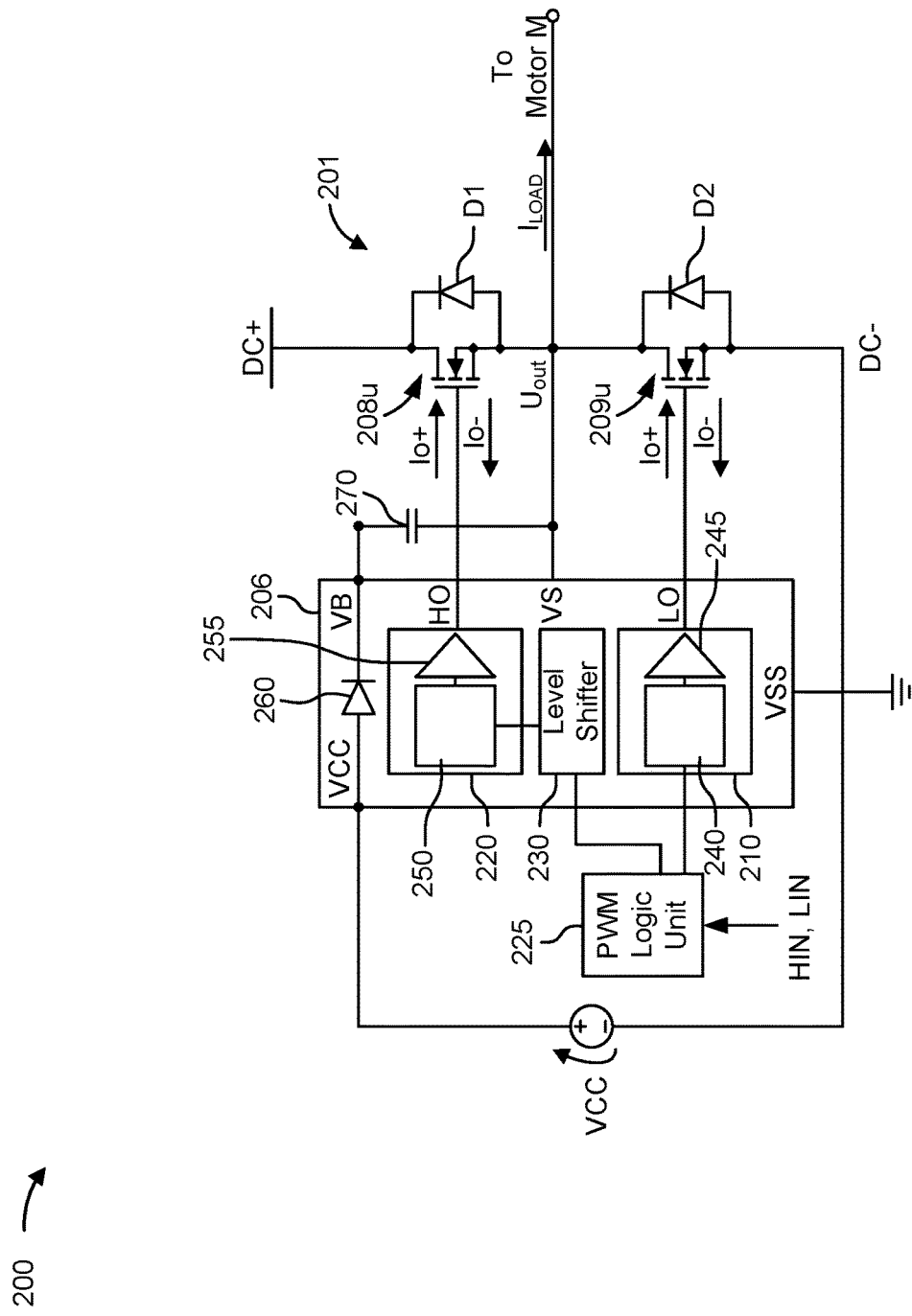
FIG. 2 illustrates a schematic block diagram of a gate driver system according to one or more implementations.

FIG. 2 illustrates a schematic block diagram of a gate driver system 200 according to one or more implementations. The gate driver system 200 may correspond to the gate driver system 106 of FIG. 1. As shown in FIG. 2, the gate driver system 200 includes a single-phase motor drive stage 201 (e.g., an inverter leg or half-bridge circuit) and a gate driver 206 electrically coupled to the single-phase motor drive stage 201. The gate driver system 200 may be a half-bridge gate driver circuit and can be duplicated for each inverter leg in the gate driver system 200. Additionally, the gate driver system 200 may be integrated into an intelligent power module (IPM), along with the power switches (e.g., a high-side power transistor and a low-side power transistor). In other words, the gate driver system 200 and the power switches may be provided in a housing, and may be arranged on an application circuit board. The housing may include external pins for providing external connections to the gate driver system 200 and the power switches, including power supply connections, control connections, and/or data connections.

The single-phase motor drive stage 201 includes a high-side transistor 208u and a low-side transistor 209u that are controlled for supplying a load current $I_{LOAD}$ to the motor M. In other words, the single-phase motor drive stage 201 in this example corresponds to a U phase inverter leg of the motor M described with regard to FIG. 1. However, the single-phase motor drive stage 201 could correspond to any inverter leg in the motor control system 100.

The gate driver 206 is a monolithic gate driver that includes a low-side gate driver 210 used to drive the low-side transistor 209u and a high-side gate driver 220 used to drive the high-side transistor 208u. Both the low-side and the high-side gate drivers 210 and 220 perform gate driving of their respective low-side transistor 209u and high-side transistor 208u based on the PWM control signals LIN and HIN received from a controller, such as the controller 104.

The PWM control signals are received from the controller 104 at a PWM logic unit 225 of the gate driver 206. The PWM logic unit 225 receives the PWM control signals LIN and HIN from the controller 104 and ensures that there is a minimum dead time implemented, during which both the high-side transistor 208u and the low-side transistor 209u are simultaneously turned off. Eventually, the PWM control signals LIN and HIN are passed on to the respective low-side and high-side gate drivers 210 and 220. In some implementations, the PWM control signal HIN, provided to the high-side gate driver 220, may be passed through a level shifter 230. The level shifter 230 is used to convert (e.g., level shift) the PWM control signal HIN, and thus transfer control information from a low voltage power domain to a high voltage power domain of the gate driver 206. After this point, the low-side and the high-side gate drivers 210 and 220 perform gate driving.

Both the low-side and high-side gate drivers 210 and 220 include separate pre-driver circuitries 240 and 250 and buffers 245 and 255, respectively. The pre-driver circuitries 240 and 250 are configured to receive the PWM control signals LIN and HIN signals and, based thereon, control the on/off state of a respective first current source, such as a source field effect transistor (FET), used to generate current Io+. Additionally, the pre-driver circuitries 240 and 250 are configured to receive the PWM control signals LIN and HIN and, based thereon, control the on/off state of a respective second current source, such as a sink FET, used to generate current Io−. The respective current sources are provided in buffers 245 and 255. Thus, the buffers 245 and 255 may each include a pair of complementary FETs used to generate turn-on currents Io+ and turn-off currents Io− for the respective low-side transistor 209u and high-side transistor 208u.

Each of the pre-driver circuitries 240 and 250 may further include a regulator that is configured to control the amplitudes of the ON current Io+ and the OFF current Io− via control of the current sources in the buffers 245 and 255. In other words, each regulator commands a respective buffer 245 and 255 to use a certain current capability.

The gate driver 206 may be configured to receive PWM control signals from the controller 104 and turn on or turn off respective high-side and low-side transistors 208u and 209u in accordance with the received PWM control signals. For example, during the turn-on process of the high-side and the low-side transistors 208u and 209u, the gate driver 206 may be used to provide (source) a gate current Io+ to the gate of one of the high-side transistor 208u or the low-side transistor 209u to charge the gate. In contrast, during the turn-off process, the gate driver 206 may be used to draw (sink) a gate current Io− from the gate of one of the high-side transistor 208u or the low-side transistor 209u to discharge the gate.

Thus, the controller 104 is electrically coupled to the gate driver 206 for the transmission of information and control signals therebetween, and the gate driver 206 is electrically coupled to the single-phase motor drive stage 201 for driving the high-side and the low-side transistors 208u and 209u.

The gate driver 206 may include high-side circuitry arranged in the high voltage power domain and configured to monitor for and detect short circuit events corresponding to the high-side transistor 208u. The high-side circuitry may be used to trigger the high-side transistor 208u to be turned off based on a short circuit event corresponding to the high-side transistor 208u being detected. Additionally, the gate driver 206 may include low-side circuitry arranged in the low voltage power domain and configured to monitor for and detect short circuit events corresponding to the low-side transistor 209u. The low-side circuitry may be used to trigger the low-side transistor 209u to be turned off based on a short circuit event corresponding to the low-side transistor 209u being detected.

The gate driver system 200 may further include a bootstrap diode 260 to charge a voltage charging device 270. In this case, the voltage charging device 270 is a bootstrap capacitor. However, the voltage charging device 270 may be a chargeable battery or another type of voltage charging device.

In addition, in FIG. 2, VB refers to a high-side floating supply voltage; VS refers to a high-side floating ground voltage, which may also be referred to as a phase voltage or a phase node voltage; VCC refers to a low-side fixed supply voltage; VSS refers to a low-side ground voltage; HO refers to an output terminal for a high-side floating output voltage; LO refers to an output terminal for a low-side output voltage; DC+ refers to a DC-link positive supply; DC− refers to a DC-link negative supply; and HIN and LIN refer to PWM control signals (e.g., logic input voltages) received from the controller 104. The low-side fixed supply voltage VCC also provides power to certain logic components of the gate driver 206 that use a fixed supply voltage to operate and may be used to charge the voltage charging device 270 when the bootstrap diode 260 is forward biased.

Typically, VB=VCC−VS−VD, where VD is a forward bias voltage drop across the bootstrap diode 260. As one example implementation, when the low-side fixed supply voltage VCC is equal to 15 V and the high-side floating ground voltage VS is equal to 0V, and the bootstrap diode 260 is forward biased and has a forward bias voltage drop of VD=0.5 V, then VB=15 V−0 V−0.5 V=14.5 V. That is, during normal operation, the high-side floating supply voltage VB is about 15 V above the high-side floating ground voltage VS due to the voltage charging device 270 supplying to a high-side of the gate driver 206. A positive power supply rail that provides the DC-link positive supply DC+ may be in the range of 200-1200 V, for example, but is not limited thereto. On top of this, the high-side floating ground voltage VS is equal to DC− (e.g., VSS or 0 V) when low-side transistor 209u is on (and high-side transistor 208u is off). A negative power supply rail provides the DC-link negative supply DC− and may be shorted to VSS, as shown, but need not be. In this case, the high-side floating supply voltage VB is near 15 V and the voltage charging device 270 is charged by the low-side fixed supply voltage VCC through the bootstrap diode 260. Otherwise, the high-side floating ground voltage VS is equal to the DC-link positive supply DC+ when the high-side transistor 208u is on (and low-side transistor 209u is off) and the bootstrap diode 260 is reverse biased and non-conducting. In the case where the bootstrap diode 260 is reverse biased, the high-side floating supply voltage VB is 15 V above the DC-link positive supply DC+ and the voltage charging device 270 is slowly discharging. It will be appreciated that certain circuit values and device parameters used herein serve as examples for illustrative purposes for one or more possible implementations out of many possible implementations and are not to be treated as limiting or required in any way unless explicitly stated.

The aforementioned voltages are set such that a high-side voltage domain of the gate driver 206 operates in a higher voltage or power domain than that of a low-side voltage domain of the gate driver 206. For example, the low-side fixed supply voltage VCC may be set to 15 V and the high-side floating supply voltage VB may be operated at a maximum voltage of 1215 V when the DC-link positive supply DC+ is 1200 V.

The gate driver 206 is configured to receive instructions from the controller 104 to drive a motor phase (e.g., single-phase motor drive stage 201) connected to the high-side floating ground voltage VS using the PWM control signals. These PWM control signals, depicted as PWM control signals HIN and LIN, are received by the gate driver 206 and passed through to the high-side gate driver 220 and the low-side gate driver 210 via the appropriate logic (e.g., the PWM logic unit 225 for the low-side gate driver 210 and the level shifter 230 for the high-side gate driver 220). The low-side gate driver 210 is configured to receive the PWM control signal LIN and the high-side gate driver 220 is configured to receive the PWM control signal HIN and drive the low-side transistor 209u and the high-side transistor 208u, respectively, using output terminals HO and LO of the gate driver 206.

As indicated above, FIG. 2 is provided merely as an example. Other examples may differ from what is described with regard to FIG. 2. For example, in some implementations, the high-side gate driver 220 may receive PWM control signals directly from the controller 104. In some implementations, the bootstrap diode 260 may be located external to the gate driver 206. In some implementations, the low-side ground voltage VSS may be connected to a supply potential different than a ground potential. In some implementations, additional circuit components may be added without deviating from the disclosure provided above.

Figure 3A:
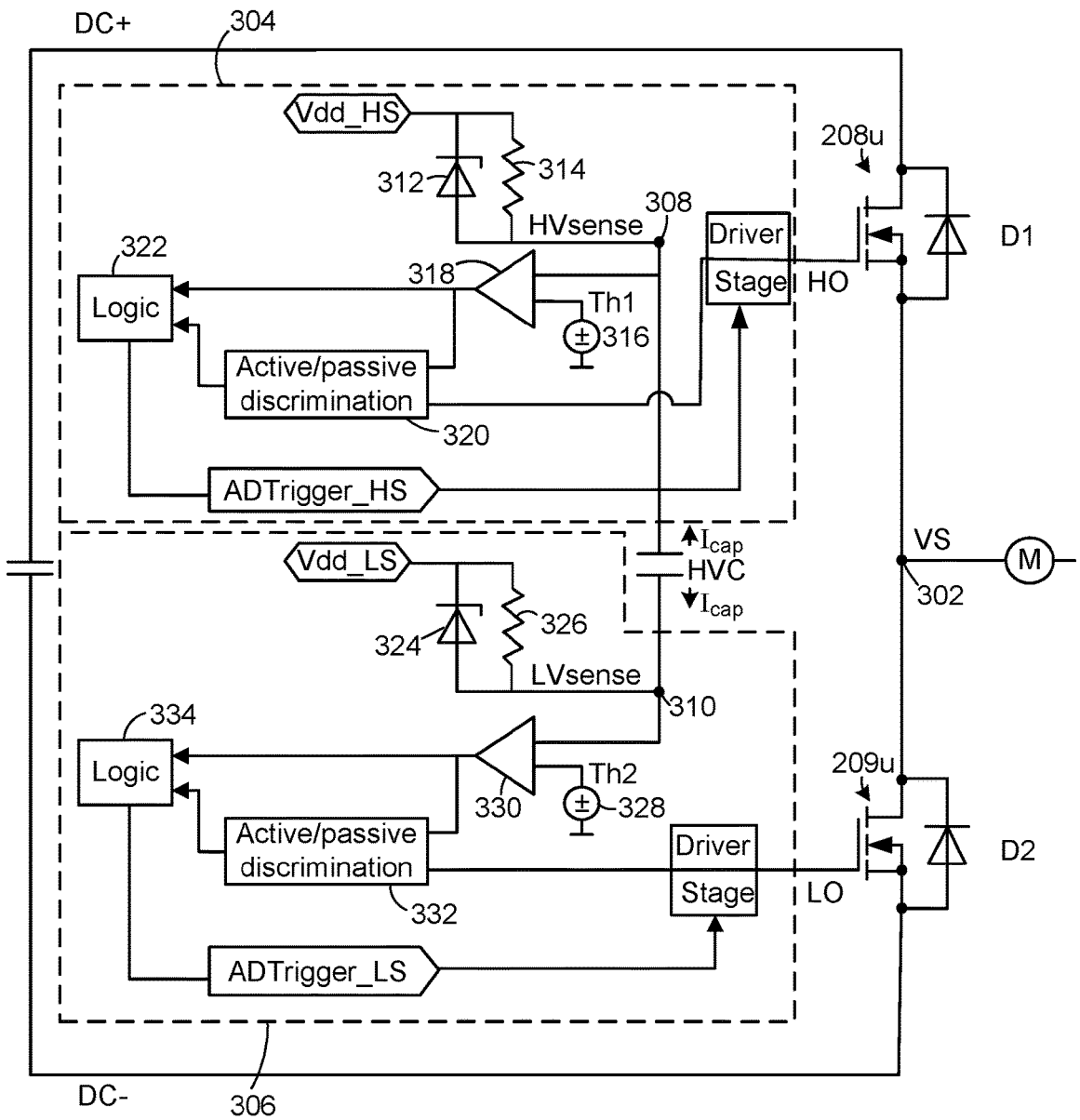
FIG. 3A illustrates a circuitry according to one or more implementations.

FIG. 3A illustrates a circuitry 300A according to one or more implementations. The circuitry 300A may be integrated in a half-bridge gate driver circuit. For example, the circuitry 300A may be integrated into a half-bridge gate driver circuit that is similar to the gate driver system 200 described in connection with FIG. 2. Additionally, or alternatively, the circuitry 300A may be integrated into an IPM, along with the power switches. In FIG. 3A, the high-side circuitry and the low-side circuitry used for regulating an adaptive dead time for a high-side power switch and an adaptive dead time for a low-side power switch are shown.

The circuitry 300A may include a phase node terminal 302 coupled to or configured to be coupled to a phase node (e.g., output pad Uout) to which the high-side transistor 208u and the low-side transistor 209u are coupled. The phase voltage Vs may be produced at the phase node according to a switching operation of the high-side transistor 208u and the low-side transistor 209u. The phase node terminal 302 may be connected to a high-side supply potential (e.g., DC+) by the high-side transistor 208u if the high-side transistor 208u is turned on by the high-side gate driver 220, and the phase node terminal 302 may be connected to a low-side supply potential (e.g., DC−) by the low-side transistor 209u if the low-side transistor 209u is turned on by the low-side gate driver 210.

The low-side transistor 209u is a complementary transistor of the high-side transistor 208u. A dead time imposed for the high-side transistor 208u is a delay or a time interval between a turn-off event of the low-side transistor 209u and a turn-on event of the high-side transistor 208u. The delay may be regulated or adjusted in order to optimize (e.g., minimize) the dead time and minimize reverse conduction losses. The turn-off event is a transition from an on-state to an off-state of a transistor, whereas a turn-on event is a transition from the off-state to the on-state of the transistor.

Additionally, the high-side transistor 208u is a complementary transistor of the low-side transistor 209u. A dead time imposed for the low-side transistor 209u is a delay or a time interval between a turn-off event of the high-side transistor 208u and a turn-on event of the low-side transistor 209u. The delay may be regulated or adjusted in order to optimize (e.g., minimize) the dead time and minimize reverse conduction losses.

The circuitry 300A may include a capacitor HVC that is cross-coupled to the high-side region and the low-side region of the circuitry 300A. The capacitor HVC may be a high-voltage capacitor. In some implementations, more than one capacitor may be cross-coupled to the high-side region and the low-side region. Thus, at least one capacitor cross-coupled to the high-side region and the low-side region is provided. The capacitor HVC may provide a capacitor current Icap that is proportional to a magnitude of a voltage slope of the phase voltage VS. In other words, the capacitor current Icap is proportional to a steepness or rate of change of a voltage transient dV/dt of the phase voltage VS. Since the DC link voltages DC+ and DC− are fixed, the voltage transient dV/dt of the phase voltage also corresponds to a respective voltage transient of the high-side transistor 208u and the low-side transistor 209u. For example, a voltage transient of a voltage $V_{DS}$ across the high-side transistor 208u is proportional to or equal to the voltage transient dV/dt of the phase voltage VS. Additionally, a voltage transient of a voltage $V_{DS}$ across the low-side transistor 209u is proportional to or equal to the voltage transient dV/dt of the phase voltage VS.

As a result, the capacitor current Icap may be based on a rate of change of the voltage $V_{DS}$ across the high-side transistor 208u and/or may be based on a rate of change of the voltage $V_{DS}$ across the low-side transistor 209u. For example, the capacitor current Icap may be proportional to a magnitude of a voltage slope of the voltage $V_{DS}$ across the high-side transistor 208u and may be proportional to a magnitude of a voltage slope of the voltage $V_{DS}$ across the low-side transistor 209u. Thus, the capacitor HVC may be used to sense and measure the voltage transient of the phase voltage VS, the voltage transient of the voltage $V_{DS}$ of the high-side transistor 208u, and/or the voltage transient of the voltage $V_{DS}$ of the low-side transistor 209u.

The circuitry 300A may include a first adaptive dead time circuit 304 arranged in the high-side region of the circuitry 300A and a second adaptive dead time circuit 306 arranged in the low-side region of the circuitry 300A. The first adaptive dead time circuit 304 is coupled to a first corresponding capacitor of the at least one capacitor, and configured to provide a first sense value representative of the voltage transient of the phase voltage VS present at the phase node. Alternatively, the first sense value may be representative of the voltage transient of the voltage $V_{DS}$ of the high-side transistor 208u. In this example, the first corresponding capacitor is the capacitor HVC. The first sense value may be a first sense voltage HVsense provided at a first sense node 308. Alternatively, the first sense value may be a first sense current corresponding to (e.g., proportional to) the capacitor current Icap. In some implementations, the first sense current may be the same current as the capacitor current Icap. The capacitor HVC may sense the voltage transient dV/dt of the phase voltage VS and provide the capacitor current Icap proportional to a slope of the voltage transient, and the capacitor current Icap may be configured to generate the first sense value at the first sense node 308.

The second adaptive dead time circuit 306 may be coupled to a second corresponding capacitor of the at least one capacitor, and configured to provide a second sense value representative of the voltage transient of the phase voltage VS present at the phase node. Alternatively, the second sense value may be representative of the voltage transient of the voltage $V_{DS}$ of the low-side transistor 209u. In this example, the second corresponding capacitor is the capacitor HVC. The second sense value may be a second sense voltage LVsense provided at a second sense node 310. Alternatively, the second sense value may be a second sense current corresponding to (e.g., proportional to) the capacitor current Icap. In some implementations, the second sense current may be the same current as the capacitor current Icap.

While the first corresponding capacitor and the second corresponding capacitor are shown in this example to be a same capacitor (e.g., the capacitor HVC), the first corresponding capacitor and the second corresponding capacitor may be different capacitors that are coupled in series or coupled to different sensing paths. The first adaptive dead time circuit 304 may include a first Zener diode 312 and a first sense resistor 314 coupled in parallel between a first internal positive supply voltage Vdd_HS (e.g., provided by a first local voltage supply) and the first sense node 308. The first sense resistor 314 may be configured to receive at least a portion of the capacitor current Icap and generate the first sense voltage HVsense at the first sense node 308 based on the portion of the capacitor current Icap flowing through the first sense resistor 314. The first sense resistor 314 can be a single resistor or multiple resistors arranged in different ways.

The first Zener diode 312 and the first sense resistor 314 may make up a first sensing circuit coupled to the capacitor HVC and configured to provide the first sense voltage HVsense at the first sense node 308 that is representative of the rate of change of the voltage present at a load terminal of the high-side transistor 208u (e.g., at the phase node terminal 302).

The high-side gate driver 220 may be configured to be coupled to the first internal positive supply voltage Vdd_HS and a first internal ground voltage. For example, the high-side gate driver 220 may use the first internal positive supply voltage Vdd_HS and the first internal ground voltage to drive the high-side transistor 208u between the on-state and the off-state. In some implementations, the first internal positive supply voltage Vdd_HS may be derived from the high-side floating supply voltage VB and the first internal ground voltage may be derived from the phase voltage VS (e.g., the high-side floating ground voltage).

The first adaptive dead time circuit 304 may further include a first reference source 316 and a first comparator circuit 318 (e.g., a voltage comparator or a current comparator). The first reference source 316 may generate a first threshold Th1 as a threshold voltage. In some implementations, the first threshold Th1 may be generated from first internal positive supply voltage Vdd_HS to be less than or higher than the first internal positive supply voltage Vdd_HS by a predetermined amount. In implementations in which the first comparator circuit 318 is a current comparator, the first reference source 316 may be a current source that is used to provide the first threshold Th1 as a threshold current to the first comparator circuit 318.

The first sensing circuit may generate the first sense value (e.g., the first sense voltage HVsense or the first sense current) at a steady state value when the phase voltage VS is in a steady state. For example, when the phase voltage VS is in a steady state, the rate of change of the phase voltage VS (e.g., the rate of change of dV/dt) is zero. As a result, the first sense voltage HVsense is also at a steady state value, which may be set to the first internal positive supply voltage Vdd_HS. In some implementations, the steady state value of the first sense voltage HVsense may be greater than the first threshold Th1 by a predetermined amount. For example, the steady state value of the first sense voltage HVsense may be 5V (e.g., Vdd_HS=5V), and the first threshold Th1 may be set to 4.8V. In some implementations, the steady state value of the first sense voltage HVsense may be less than the first threshold Th1 by a predetermined amount. For example, the steady state value of the first sense voltage HVsense may be 5V (e.g., Vdd_HS=5V), and the first threshold Th1 may be set to 5.2V.

The first comparator circuit 318 may compare a first sense value (e.g., the first sense voltage HVsense or the first sense current) to the first threshold Th1, and may generate a first comparison result based on whether the first sense value satisfies the first threshold Th1. For example, the first comparator circuit 318 may generate a logic high output when the first sense value is equal to or greater than the first threshold Th1, and may generate a logic low output when the first sense value is less than the first threshold Th1.

The first adaptive dead time circuit 304 may further include a first active-passive discrimination circuit 320 and a first logic circuit 322. The first adaptive dead time circuit 304 may detect an occurrence of a dV/dt event corresponding to a turn-off of the low-side transistor 209u, and further detect a moment in time when the dV/dt event is finished. Thus, the first adaptive dead time circuit 304 may detect a start of the dV/dt event and an end of the dV/dt event. The first adaptive dead time circuit 304 may trigger an end of the adaptive dead time of the high-side transistor 208u based on (e.g., in response to) detecting the end of the dV/dt event of the low-side transistor 209u.

A change in an output state of the first comparator circuit 318 may indicate a threshold crossing of the first threshold Th1. During a turn-off event of the low-side transistor 209u, the first sense voltage HVsense deviates from the steady state value. For example, at a beginning of the dV/dt event, the first sense voltage HVsense may undergo a falling transition and cross the first threshold Th1. The crossing of the first threshold Th1 during the falling transition may cause the output of the first comparator circuit 318 to change from the logic high value to the logic low value, indicating the beginning of the dV/dt event. The dV/dt event is finished when the phase voltage VS enters a steady state. Thus, at an end of the dV/dt event, the first sense voltage HVsense may return to the steady state value. In other words, at the end of the dV/dt event, the first sense voltage HVsense may undergo a rising transition and, again, cross the first threshold Th1—this time from an opposite direction. The crossing of the first threshold Th1 during the rising transition may cause the output of the first comparator circuit 318 to change from the logic low value to the logic high value, indicating the end of the dV/dt event. In some implementations, the beginning of the dV/dt event may be indicated by a rising transition of the first sense voltage HVsense, and the end of the dV/dt event may be indicated by a falling transition of the first sense voltage HVsense.

The first logic circuit 322 may include one or more logic gates, one or more processors, or a combination of one or more logic gates and one or more processors. The first logic circuit 322 may detect that a dV/dt event (e.g., a voltage transient dV/dt) is occurring based on the first comparison result indicating that the first sense voltage HVsense satisfies the first threshold Th1, and may detect that a dV/dt event (e.g., a voltage transient dV/dt) is not occurring based on the first comparison result indicating that the first sense voltage HVsense does not satisfy the first threshold Th1. The first logic circuit 322 may receive the first comparison result of the first comparator circuit 318 for monitoring and detecting dV/dt events corresponding to the turn-off of the low-side transistor 209u. For example, the first logic circuit 322 may detect the voltage transient dV/dt of the phase voltage VS (or the voltage of the load terminal) based on the first comparison result indicating a first crossing of the first threshold Th1, and detect an end of the voltage transient dV/dt of the phase voltage VS (or the voltage of the load terminal) based on the first comparison result indicating a second crossing of the first threshold Th1. Here, the second crossing occurs subsequently to the first crossing and in an opposite direction to the first crossing. Thus, the first logic circuit 322 may detect the beginning of the dV/dt event based on the first crossing of the first threshold Th1, and may detect the end of the dV/dt event based on the second crossing of the first threshold Th1.

In some implementations, the first comparator circuit 318 may directly detect the beginning and the end of the voltage transient dV/dt and pass this information to the first logic circuit 322. For example, the first logic circuit 322 may process the first comparison result (e.g., a comparator output) of the first comparator circuit 318, and detect the beginning and the end of the voltage transient dV/dt from the first comparison result of the first comparator circuit 318. Thus, the first comparison result of the first comparator circuit 318 may indicate a start of the voltage transient dV/dt and may further indicate the end of the voltage transient dV/dt.

When the first threshold Th1 is less than the steady state value of the first sense voltage HVsense, the first crossing of the first threshold Th1 may correspond to a falling edge of the first sense voltage HVsense, and the second crossing of the first threshold Th1 may correspond to a rising edge of the first sense voltage HVsense. Turning off the complementary transistor (e.g., low-side transistor 209u) that is coupled to the load terminal of the high-side transistor 208u may induce the voltage transient dV/dt and cause the first sense voltage HVsense to satisfy the first threshold Th1 by causing the first sense voltage HVsense to be less than the first threshold Th1.

Alternatively, when the first threshold Th1 is greater than the steady state value of the first sense voltage HVsense, the first crossing of the first threshold Th1 may correspond to a rising edge of the first sense voltage HVsense, and the second crossing of the first threshold Th1 may correspond to a falling edge of the first sense voltage HVsense. Turning off the complementary transistor (e.g., low-side transistor 209u) that is coupled to the load terminal of the high-side transistor 208u may induce the voltage transient dV/dt and cause the first sense voltage HVsense to satisfy the first threshold Th1 by causing the first sense voltage HVsense to be greater than the first threshold Th1.

In addition, the first active-passive discrimination circuit 320 may detect a switching state of the high-side transistor 208u, including whether the high-side transistor 208u is in the on-state or in the off-state. For example, the first active-passive discrimination circuit 320 may monitor a gate voltage of the high-side transistor 208u, the PWM control signal HIN, or the output terminal HO of the high-side transistor 208u for determining the switching state of the high-side transistor 208u. The first active-passive discrimination circuit 320 may indicate to the first logic circuit 322 whether the voltage transient dV/dt is an active voltage transient or a passive voltage transient based on the switching state of the high-side transistor 208u. For example, the first active-passive discrimination circuit 320 may determine that the voltage transient dV/dt is the active voltage transient if the high-side transistor 208u is in the on-state at a beginning of the voltage transient dV/dt, and determine that the voltage transient dV/dt is the passive voltage transient if the high-side transistor 208u is in the off-state at the beginning of the voltage transient dV/dt. In some implementations, the first active-passive discrimination circuit 320 may receive the first comparison result of the first comparator circuit 318 and detect the first crossing of the first threshold Th1 as an indicator of the beginning of the voltage transient dV/dt. Based on (e.g., in response to) detecting the beginning of the voltage transient dV/dt, the first active-passive discrimination circuit 320 may evaluate the switching state of the high-side transistor 208u and determine whether the voltage transient dV/dt is an active voltage transient or a passive voltage transient based on the switching state of the high-side transistor 208u. In other words, the first active-passive discrimination circuit 320 may receive the first comparison result, detect the voltage transient dV/dt based on the first comparison result indicating the first crossing of the first threshold Th1, and determine whether the voltage transient dV/dt, corresponding to the first crossing of the first threshold Th1, is an active voltage transient or a passive voltage transient based on the switching state of the high-side transistor 208u. The first active-passive discrimination circuit 320 may indicate to the first logic circuit 322 with a logic high output that the voltage transient dV/dt is an active voltage transient, and with a logic low output that the voltage transient dV/dt is a passive voltage transient, or vice versa.

Thus, the first active-passive discrimination circuit 320 may determine the active/passive nature of the voltage transient dV/dt by monitoring the state of the power switch (e.g., by monitoring the PWM, HIN, or HO) and by monitoring the comparator output (e.g., the first comparison result) of the first comparator circuit 318. The first comparator circuit 318 may detect whether the voltage transient dV/dt is present or not, and produce a square pulse which represents the voltage transient dV/dt. The first active-passive discrimination circuit 320 may check if the voltage transient dV/dt is happening during a deadtime or not by checking the on status via PWM, HIN, or HO. Finally, the first active-passive discrimination circuit 320 may discriminate whether the voltage transient dV/dt is active or passive.

The first logic circuit 322 may to regulate the adaptive dead time of the high-side transistor 208u based on the first comparison result of the first comparator circuit 318 indicating the second crossing of the first threshold Th1 and based on the first active-passive discrimination circuit 320 indicating that the voltage transient is a passive voltage transient, which occurs when the high-side transistor 208u is in the off-state at the beginning of the voltage transient dV/dt (e.g., at the first crossing of the first threshold Th1).

The first logic circuit 322 may trigger the high-side transistor 208u to be switched from the off-state to the on-state, thereby ending the current dead time of the high-side transistor 208u, based on the first active-passive discrimination circuit 320 indicating that the voltage transient dV/dt is a passive voltage transient and in response to the first comparison result of the first comparator circuit 318 indicating the second crossing of the first threshold Th1. Thus, the first logic circuit 322 may trigger the end of the current dead time only when the voltage transient dV/dt is a passive voltage transient. If the voltage transient dV/dt is an active voltage transient, a default duration may be used for the current dead time. The first logic circuit 322 may trigger the end of the current dead time by generating a trigger signal ADTtrigger_HS. The first logic circuit 322 may provide the trigger signal ADTtrigger_HS to a driver stage of the high-side gate driver 220. Additionally, or alternatively, the first logic circuit 322 may provide the trigger signal ADTtrigger_HS to the controller 104 to initiate the switching of the high-side transistor 208u from the off-state to the on-state.

Accordingly, the first logic circuit 322 may adjust the adaptive dead time of the high-side transistor 208u based on detecting the second crossing of the first threshold Th1 and based on the voltage transient dV/dt being the passive voltage transient. The adaptive dead time may be adjusted based on a timing of when the second crossing of the first threshold Th1 occurs. For example, the first logic circuit 322 may trigger the end of the current dead time in response to detecting the second crossing of the first threshold Th1. Thus, since the second crossing of the first threshold Th1 may fluctuate for each switching cycle, the first logic circuit 322 may regulate the adaptive dead time for each switching cycle. By triggering the end of the current dead time in response to detecting the second crossing of the first threshold Th1, the first logic circuit 322 may minimize the adaptive dead time.

The second adaptive dead time circuit 306 may operate similarly to the first adaptive dead time circuit 304 for the low-side transistor 209u. The second adaptive dead time circuit 306 may include a second Zener diode 324 and a second sense resistor 326 coupled in parallel between a second internal positive supply voltage Vdd_LS (e.g., provided by a second local voltage supply) and the second sense node 310. The second sense resistor 326 may be configured to receive at least a portion of the capacitor current Icap and generate the second sense voltage LVsense at the second sense node 310 based on the portion of the capacitor current Icap flowing through the second sense resistor 326. The second sense resistor 326 can be a single resistor or multiple resistors arranged in different ways.

The second Zener diode 324 and the second sense resistor 326 may make up a second sensing circuit coupled to the capacitor HVC and configured to provide the second sense voltage LVsense at the second sense node 310 that is representative of the rate of change of the voltage present at a load terminal of the low-side transistor 209u (e.g., at the phase node terminal 302).

The low-side gate driver 210 may be configured to be coupled to the second internal positive supply voltage Vdd_LS and a second internal ground voltage. For example, the low-side gate driver 210 may use the second internal positive supply voltage Vdd_LS and the second internal ground voltage to drive the low-side transistor 209u between the on-state and the off-state. In some implementations, the second internal positive supply voltage Vdd_LS may be derived from the low-side fixed supply voltage VCC and the second internal ground voltage may be derived from ground (e.g., a low-side fixed ground voltage).

The second adaptive dead time circuit 306 may further include a second reference source 328 and a second comparator circuit 330 (e.g., a voltage comparator or a current comparator). The second reference source 328 may generate a second threshold Th2 as a threshold voltage. In some implementations, the second threshold Th2 may be generated from second internal positive supply voltage Vdd_LS to be less than or higher than the second internal positive supply voltage Vdd_LS by a predetermined amount. In implementations in which the second comparator circuit 330 is a current comparator, the second reference source 328 may be a current source that is used to provide the second threshold Th2 as a threshold current to the second comparator circuit 330.

The first sensing circuit may generate the second sense value (e.g., the second sense voltage LVsense or the second sense current) at a steady state value when the phase voltage VS is in a steady state. For example, when the phase voltage VS is in a steady state, the rate of change of the phase voltage VS (e.g., the rate of change of dV/dt) is zero. As a result, the second sense voltage LVsense is also at a steady state value, which may be set to the second internal positive supply voltage Vdd_LS. In some implementations, the steady state value of the second sense voltage LVsense may be greater than the second threshold Th2 by a predetermined amount. For example, the steady state value of the second sense voltage LVsense may be 5 V (e.g., Vdd_HS=5 V), and the second threshold Th2 may be set to 4.8 V. In some implementations, the steady state value of the second sense voltage LVsense may be less than the second threshold Th2 by a predetermined amount. For example, the steady state value of the second sense voltage LVsense may be 5 V (e.g., Vdd_HS=5 V), and the second threshold Th2 may be set to 5.2 V.

The second comparator circuit 330 may compare a second sense value (e.g., the second sense voltage LVsense or the first sense current) to the second threshold Th2, and may generate a second comparison result based on whether the second sense value satisfies the second threshold Th2. For example, the second comparator circuit 330 may generate a logic high output when the second sense value is equal to or greater than the second threshold Th2, and may generate a logic low output when the second sense value is less than the second threshold Th2.

The second adaptive dead time circuit 306 may further include a second active-passive discrimination circuit 332 and a second logic circuit 334. The second adaptive dead time circuit 306 may detect an occurrence of a dV/dt event corresponding to a turn-off of the high-side transistor 208u, and further detect a moment in time when the dV/dt event is finished. Thus, the first adaptive dead time circuit 304 may detect a start of the dV/dt event and an end of the dV/dt event. The first adaptive dead time circuit 304 may trigger an end of the adaptive dead time of the low-side transistor 209u based on (e.g., in response to) detecting the end of the dV/dt event of the high-side transistor 208u.

A change in an output state of the second comparator circuit 330 may indicate a threshold crossing of the second threshold Th2. During a turn-off event of the high-side transistor 208u, the second sense voltage LVsense deviates from the steady state value. For example, at a beginning of the dV/dt event, the second sense voltage LVsense may undergo a falling transition and cross the second threshold Th2. The crossing of the second threshold Th2 during the falling transition may cause the output of the second comparator circuit 330 to change from the logic high value to the logic low value, indicating the beginning of the dV/dt event. The dV/dt event is finished when the phase voltage VS enters a steady state. Thus, at an end of the dV/dt event, the second sense voltage LVsense may return to the steady state value. In other words, at the end of the dV/dt event, the second sense voltage LVsense may undergo a rising transition and, again, cross the second threshold Th2—this time from an opposite direction. The crossing of the second threshold Th2 during the rising transition may cause the output of the second comparator circuit 330 to change from the logic low value to the logic high value, indicating the end of the dV/dt event. In some implementations, the beginning of the dV/dt event may be indicated by a rising transition of the second sense voltage LVsense, and the end of the dV/dt event may be indicated by a falling transition of the second sense voltage LVsense.

As a result, the second comparator circuit 330 may detect the voltage transient dV/dt (e.g., a beginning of the dV/dt event) based on a first crossing of the second threshold Th2, and may detect an end of the voltage transient dV/dt based on a second crossing of the second threshold Th2. The second crossing occurs subsequent to the first crossing and in an opposite direction to the first crossing. Thus, the second comparison result (e.g., a comparator output) of the second comparator circuit 330 may indicate a start of the voltage transient dV/dt and may further indicate the end of the voltage transient dV/dt.

The second logic circuit 334 may include one or more logic gates, one or more processors, or a combination of one or more logic gates and one or more processors. The second logic circuit 334 may detect that a dV/dt event (e.g., a voltage transient dV/dt) is occurring based on the second comparison result indicating that the second sense voltage LVsense satisfies the second threshold Th2, and may detect that a dV/dt event (e.g., a voltage transient dV/dt) is not occurring based on the second comparison result indicating that the second sense voltage LVsense does not satisfy the second threshold Th2. The second logic circuit 334 may receive the second comparison result of the second comparator circuit 330 for monitoring and detecting dV/dt events corresponding to the turn-off of the high-side transistor 208*u*. For example, the second logic circuit 334 may detect the voltage transient dV/dt of the phase voltage VS (or the voltage of the load terminal) based on the second comparison result indicating a first crossing of the second threshold Th2, and detect an end of the voltage transient dV/dt of the phase voltage VS (or the voltage of the load terminal) based on the second comparison result indicating a second crossing of the second threshold Th2. Here, the second crossing occurs subsequently to the first crossing and in an opposite direction to the first crossing. Thus, the second logic circuit 334 may detect the beginning of the dV/dt event based on the first crossing of the second threshold Th2, and may detect the end of the dV/dt event based on the second crossing of the second threshold Th2. In some implementations, the second comparator circuit 330 may directly detect the beginning and the end of the voltage transient dV/dt and pass this information to the second logic circuit 334. For example, the second logic circuit 334 may process the second comparison result (e.g., a comparator output) of the second comparator circuit 330, and detect the beginning and the end of the voltage transient dV/dt from the second comparison result of the second comparator circuit 330. Thus, the second comparison result of the second comparator circuit 330 may indicate a start of the voltage transient dV/dt and may further indicate the end of the voltage transient dV/dt.

When the second threshold Th2 is less than the steady state value of the second sense voltage LVsense, the first crossing of the second threshold Th2 may correspond to a falling edge of the second sense voltage LVsense, and the second crossing of the second threshold Th2 may correspond to a rising edge of the second sense voltage LVsense. Turning off the complementary transistor (e.g., high-side transistor 208*u*) that is coupled to the load terminal of the low-side transistor 209*u* may induce the voltage transient dV/dt and cause the second sense voltage LVsense to satisfy the second threshold Th2 by causing the second sense voltage LVsense to be less than the second threshold Th2.

Alternatively, when the second threshold Th2 is greater than the steady state value of the second sense voltage LVsense, the first crossing of the second threshold Th2 may correspond to a rising edge of the second sense voltage LVsense, and the second crossing of the second threshold Th2 may correspond to a falling edge of the second sense voltage LVsense. Turning off the complementary transistor (e.g., high-side transistor 208*u*) that is coupled to the load terminal of the low-side transistor 209*u* may induce the voltage transient dV/dt and cause the second sense voltage LVsense to satisfy the second threshold Th2 by causing the second sense voltage LVsense to be greater than the second threshold Th2.

In addition, the second active-passive discrimination circuit 332 may detect a switching state of the low-side transistor 209*u*, including whether the low-side transistor 209*u* is in the on-state or in the off-state. For example, the second active-passive discrimination circuit 332 may monitor a gate voltage of the low-side transistor 209*u*, the PWM control signal LIN, or the output terminal LO of the low-side transistor 209*u* for determining the switching state of the low-side transistor 209*u*. The second active-passive discrimination circuit 332 may indicate to the second logic circuit 334 whether the voltage transient dV/dt is an active voltage transient or a passive voltage transient based on the switching state of the low-side transistor 209*u*. For example, the second active-passive discrimination circuit 332 may determine that the voltage transient dV/dt is the active voltage transient if the low-side transistor 209*u* is in the on-state at a beginning of the voltage transient dV/dt, and determine that the voltage transient dV/dt is the passive voltage transient if the low-side transistor 209*u* is in the off-state at the beginning of the voltage transient dV/dt. In some implementations, the second active-passive discrimination circuit 332 may receive the second comparison result of the second comparator circuit 330 and detect the first crossing of the second threshold Th2 as an indicator of the beginning of the voltage transient dV/dt. Based on (e.g., in response to) detecting the beginning of the voltage transient dV/dt, the second active-passive discrimination circuit 332 may evaluate the switching state of the low-side transistor 209*u* and determine whether the voltage transient dV/dt is an active voltage transient or a passive voltage transient based on the switching state of the low-side transistor 209*u*. In other words, the second active-passive discrimination circuit 332 may receive the second comparison result, detect the voltage transient dV/dt based on the second comparison result indicating the first crossing of the second threshold Th2, and determine whether the voltage transient dV/dt, corresponding to the first crossing of the second threshold Th2, is an active voltage transient or a passive voltage transient based on the switching state of the low-side transistor 209*u*. The second active-passive discrimination circuit 332 may indicate to the second logic circuit 334 with a logic high output that the voltage transient dV/dt is an active voltage transient, and with a logic low output that the voltage transient dV/dt is a passive voltage transient, or vice versa.

Thus, the second active-passive discrimination circuit 332 may determine the active/passive nature of the voltage transient dV/dt by monitoring the state of the power switch (e.g., by monitoring the PWM, LIN, or LO) and by monitoring the comparator output (e.g., the second comparison result) of the second comparator circuit 330. The second comparator circuit 330 may detect whether the voltage transient dV/dt is present or not, and produce a square pulse which represents the voltage transient dV/dt. The second active-passive discrimination circuit 332 may check if the voltage transient dV/dt is happening during a deadtime or not by checking the on status via PWM, LIN, or LO. Finally, the second active-passive discrimination circuit 332 may discriminate whether the voltage transient dV/dt is active or passive.

The second logic circuit 334 may regulate the adaptive dead time of the low-side transistor 209*u* based on the second comparison result of the second comparator circuit 330 indicating the second crossing of the second threshold Th2 and based on the second active-passive discrimination circuit 332 indicating that the voltage transient is a passive voltage transient, which occurs when the low-side transistor 209*u* is in the off-state at the beginning of the voltage transient dV/dt (e.g., at the first crossing of the second threshold Th2).

The second logic circuit 334 may trigger the low-side transistor 209*u* to be switched from the off-state to the on-state, thereby ending the current dead time of the low-side transistor 209*u*, based on the second active-passive discrimination circuit 332 indicating that the voltage transient dV/dt is a passive voltage transient and in response to the second comparison result of the second comparator circuit 330 indicating the second crossing of the second threshold Th2. Thus, the second logic circuit 334 may trigger the end of the current dead time only when the voltage transient dV/dt is a passive voltage transient. If the voltage transient dV/dt is an active voltage transient, a default duration may be used for the current dead time. The second logic circuit 334 may trigger the end of the current dead time by generating a trigger signal ADTtrigger_LS. The second logic circuit 334 may provide the trigger signal ADTtrigger_LS to a driver stage of the low-side gate driver 210. Additionally, or alternatively, the second logic circuit 334 may provide the trigger signal ADTtrigger_LS to the controller 104 to initiate the switching of the low-side transistor 209u from the off-state to the on-state.

Accordingly, the second logic circuit 334 may adjust the adaptive dead time of the low-side transistor 209u based on detecting the second crossing of the second threshold Th2 and based on the voltage transient dV/dt being the passive voltage transient. The adaptive dead time may be adjusted based on a timing of when the second crossing of the second threshold Th2 occurs. For example, the second logic circuit 334 may trigger the end of the current dead time in response to detecting the second crossing of the second threshold Th2. Thus, since the second crossing of the second threshold Th2 may fluctuate for each switching cycle, the second logic circuit 334 may regulate the adaptive dead time for each switching cycle. By triggering the end of the current dead time in response to detecting the second crossing of the second threshold Th2, the second logic circuit 334 may minimize the adaptive dead time.

As indicated above, FIG. 3A is provided as an example. Other examples may differ from what is described with regard to FIG. 3A. The number and arrangement of components shown in FIG. 3A are provided as an example. In practice, the circuitry 300A may include additional components, fewer components, different components, or differently arranged components than those shown in FIG. 3A. Two or more components shown in FIG. 3A may be implemented within a single component, or a single component shown in FIG. 3A may be implemented as multiple, distributed components. Additionally, or alternatively, a set of components (e.g., one or more components) of the circuitry 300A may perform one or more functions described as being performed by another set of components of the circuitry 300A.

Figure 3B:
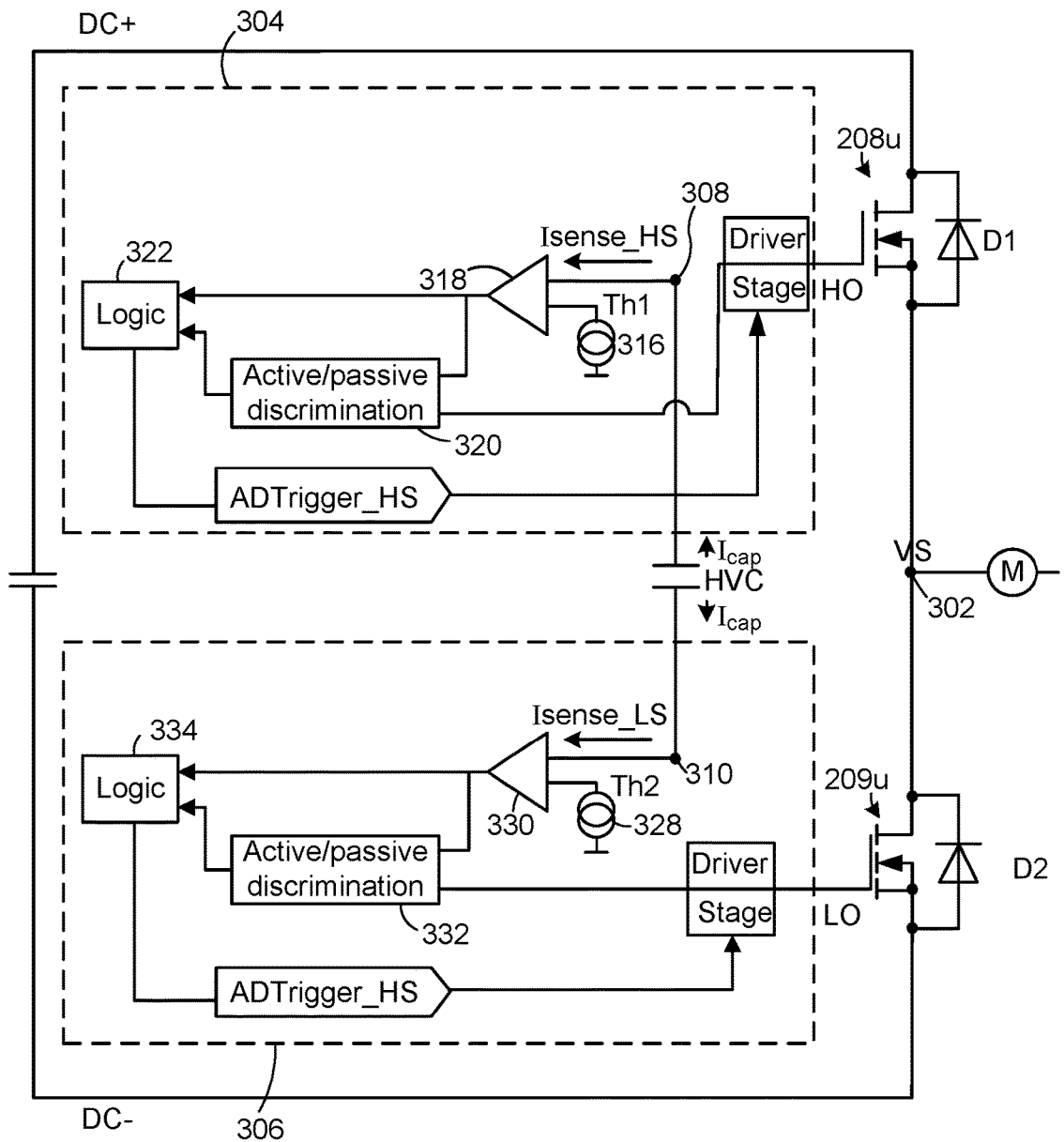
FIG. 3B illustrates a circuitry according to one or more implementations.

FIG. 3B illustrates a circuitry 300B according to one or more implementations. The circuitry 300B may be similar to the circuitry 300A described in connection with FIG. 3A, with the exception that the first comparator circuit 318 and the second comparator circuit 330 are current comparators. Thus, the first reference source 316 and the second reference source 328 may be current sources instead of voltage sources. For example, the first reference source 316 and the second reference source 328 may provide reference currents as thresholds Th1 and Th2, respectively. In addition, the first comparator circuit 318 and the second comparator circuit 330 are configured to receive sense currents Isense that correspond to the capacitor current Icap.

When the first threshold Th1 is less than the steady state value of a first sense current Isense_HS, a first crossing of the first threshold Th1 may correspond to a falling edge of the first sense current Isense_HS, and the second crossing of the first threshold Th1 may correspond to a rising edge of the first sense current Isense_HS. Turning off the complementary transistor (e.g., low-side transistor 209u) that is coupled to the load terminal of the high-side transistor 208u may induce the voltage transient dV/dt and cause the first sense current Isense_HS to satisfy the first threshold Th1 by causing the first sense current Isense_HS to be less than the first threshold Th1. Alternatively, when the first threshold Th1 is greater than the steady state value of the first sense current Isense_HS, the first crossing of the first threshold Th1 may correspond to a rising edge of the first sense current Isense_HS, and the second crossing of the first threshold Th1 may correspond to a falling edge of the first sense current Isense_HS. Turning off the complementary transistor (e.g., low-side transistor 209u) that is coupled to the load terminal of the high-side transistor 208u may induce the voltage transient dV/dt and cause the first sense current Isense_HS to satisfy the first threshold Th1 by causing the first sense current Isense_HS to be greater than the first threshold Th1.

When the second threshold Th2 is less than the steady state value of a second sense current Isense_LS, a first crossing of the second threshold Th2 may correspond to a falling edge of the second sense current Isense_LS, and the second crossing of the second threshold Th2 may correspond to a rising edge of the second sense current Isense_LS. Turning off the complementary transistor (e.g., high-side transistor 208u) that is coupled to the load terminal of the low-side transistor 209u may induce the voltage transient dV/dt and cause the second sense current Isense_LS to satisfy the second threshold Th2 by causing the second sense current Isense_LS to be less than the second threshold Th2. Alternatively, when the second threshold Th2 is greater than the steady state value of the second sense current Isense_LS, the first crossing of the second threshold Th2 may correspond to a rising edge of the second sense current Isense_LS, and the second crossing of the second threshold Th2 may correspond to a falling edge of the second sense current Isense_LS. Turning off the complementary transistor (e.g., high-side transistor 208u) that is coupled to the load terminal of the low-side transistor 209u may induce the voltage transient dV/dt and cause the second sense current Isense_LS to satisfy the second threshold Th2 by causing the second sense current Isense_LS to be greater than the second threshold Th2.

The first adaptive dead time circuit 304 may detect an occurrence of a dV/dt event corresponding to a turn-off of the low-side transistor 209u, and further detect a moment in time when the dV/dt event is finished, as described above. The second adaptive dead time circuit 306 may detect an occurrence of a dV/dt event corresponding to a turn-off of the high-side transistor 208u, and further detect a moment in time when the dV/dt event is finished, as described above.

The first active-passive discrimination circuit 320 may indicate to the first logic circuit 322 whether the voltage transient dV/dt is an active voltage transient or a passive voltage transient based on the switching state of the high-side transistor 208u, as described above. The second active-passive discrimination circuit 332 may indicate to the second logic circuit 334 whether the voltage transient dV/dt is an active voltage transient or a passive voltage transient based on the switching state of the low-side transistor 209u, as described above.

The first logic circuit 322 may adjust the adaptive dead time of the high-side transistor 208u based on detecting the second crossing of the first threshold Th1 and based on the voltage transient dV/dt being the passive voltage transient. The adaptive dead time may be adjusted based on a timing of when the second crossing of the first threshold Th1 occurs. For example, the first logic circuit 322 may trigger the end of the current dead time in response to detecting the second crossing of the first threshold Th1. Thus, since the second crossing of the first threshold Th1 may fluctuate for each switching cycle, the first logic circuit 322 may regulate the adaptive dead time for each switching cycle. By triggering the end of the current dead time in response to detecting the second crossing of the first threshold Th1, the first logic circuit 322 may minimize the adaptive dead time.

The second logic circuit 334 may adjust the adaptive dead time of the low-side transistor 209u based on detecting the second crossing of the second threshold Th2 and based on the voltage transient dV/dt being the passive voltage transient. The adaptive dead time may be adjusted based on a timing of when the second crossing of the second threshold Th2 occurs. For example, the second logic circuit 334 may trigger the end of the current dead time in response to detecting the second crossing of the second threshold Th2. Thus, since the second crossing of the second threshold Th2 may fluctuate for each switching cycle, the second logic circuit 334 may regulate the adaptive dead time for each switching cycle. By triggering the end of the current dead time in response to detecting the second crossing of the second threshold Th2, the second logic circuit 334 may minimize the adaptive dead time.

As indicated above, FIG. 3B is provided as an example. Other examples may differ from what is described with regard to FIG. 3B. The number and arrangement of components shown in FIG. 3B are provided as an example. In practice, the circuitry 300B may include additional components, fewer components, different components, or differently arranged components than those shown in FIG. 3B. Two or more components shown in FIG. 3B may be implemented within a single component, or a single component shown in FIG. 3B may be implemented as multiple, distributed components. Additionally, or alternatively, a set of components (e.g., one or more components) of the circuitry 300B may perform one or more functions described as being performed by another set of components of the circuitry 300B.

Figure 4A:
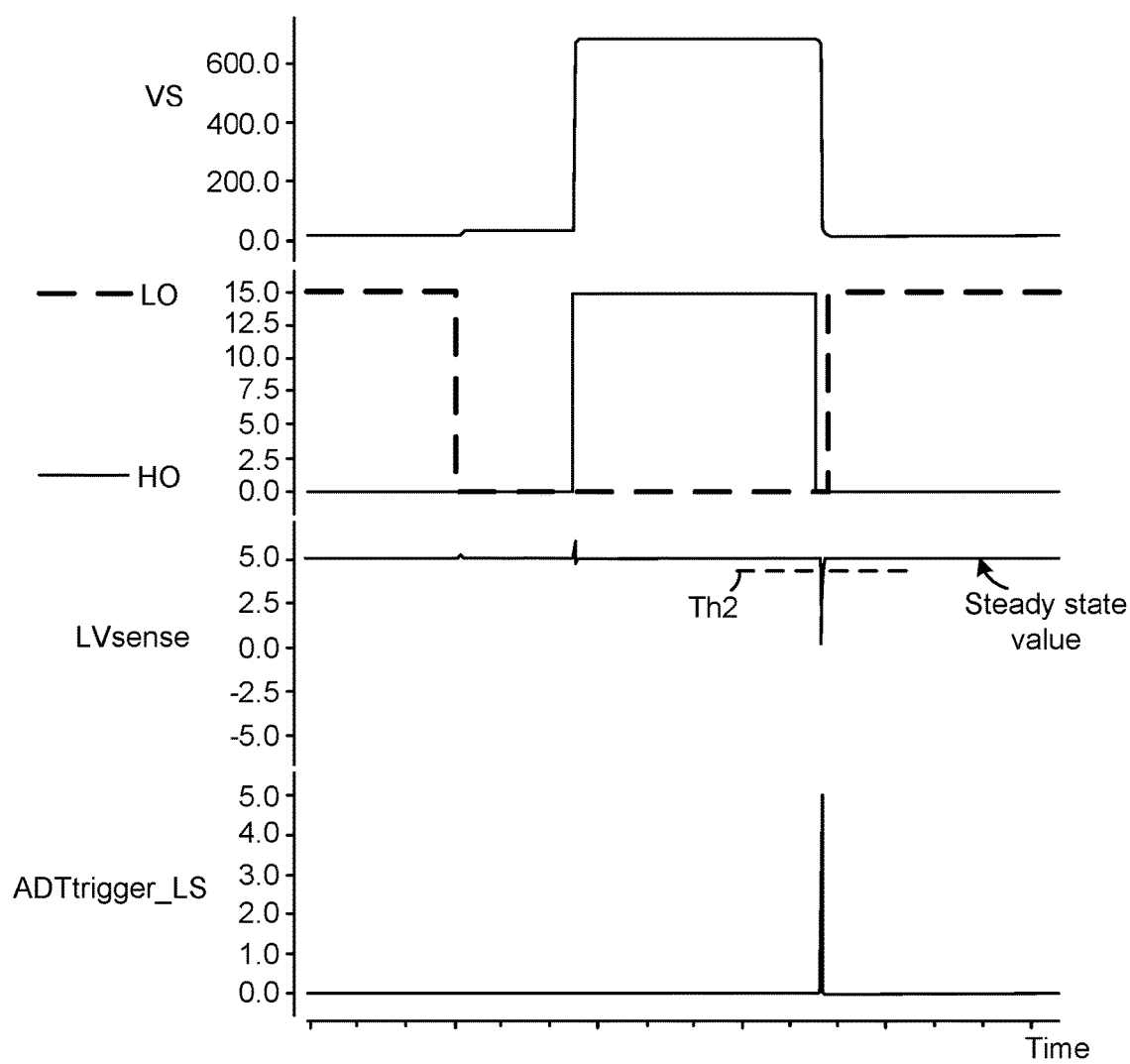
FIGS. 4A and 4B illustrate signal diagrams corresponding to an adaptive dead time for a low-side power switch according to one or more implementations.
Figure 4B:
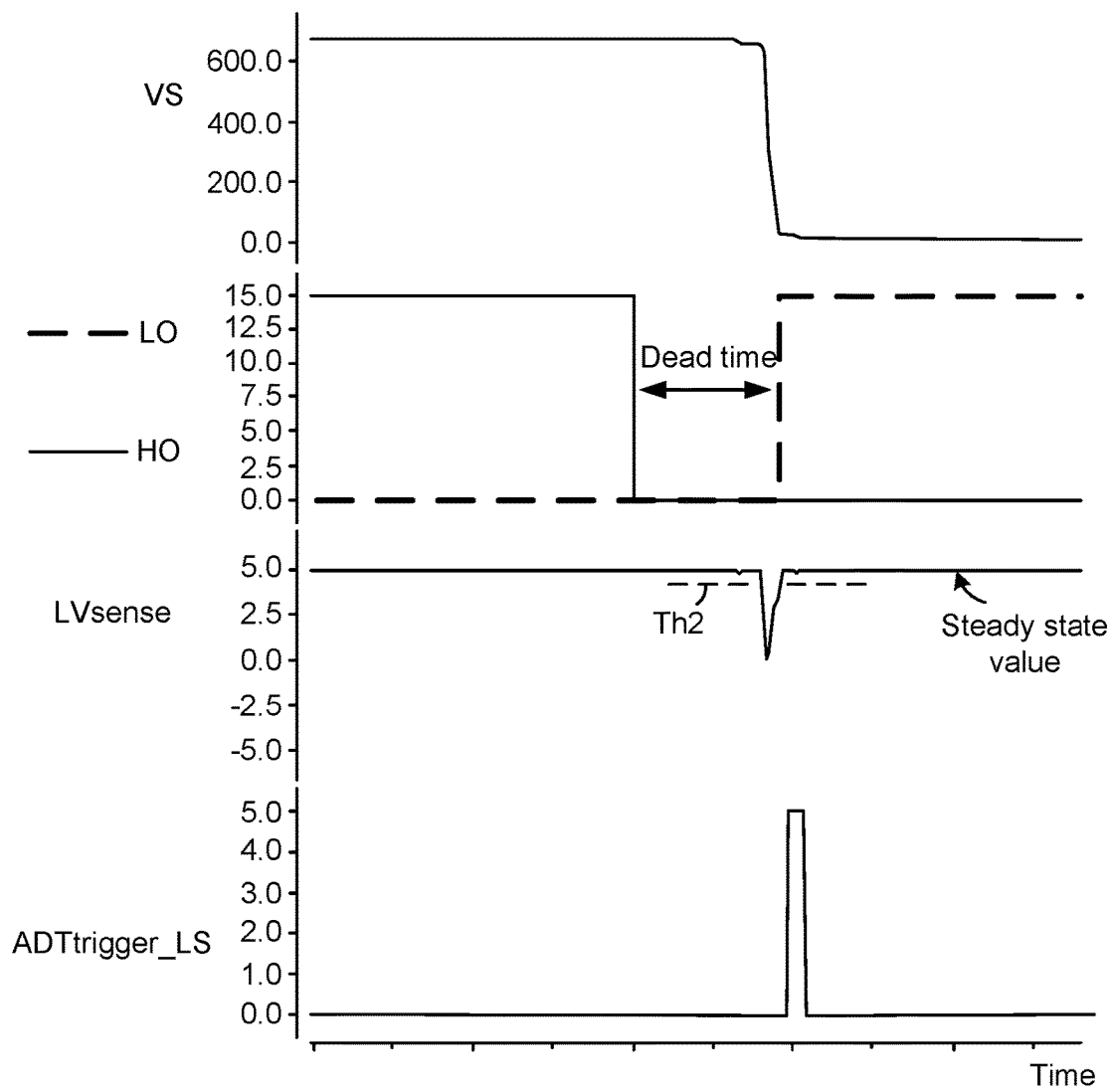

FIGS. 4A and 4B illustrate signal diagrams 400A and 400B corresponding to an adaptive dead time for a low-side power switch according to one or more implementations. Signal diagram 400B shown in FIG. 4B shows a zoomed in portion of signal diagram 400A shown in FIG. 4A. The adaptive dead time may be a delay between a turn-off event of the high-side power transistor 208u and a turn-on event of the low-side power transistor 209u.

The high-side floating output voltage at the output terminal HO is high when the high-side transistor 208u is on, and the high-side floating output voltage at the output terminal HO is low when the high-side transistor 208u is off. The low-side output voltage at the output terminal LO is high when the low-side transistor 209u is on, and the low-side output voltage at the output terminal LO is low when the low-side transistor 209u is off. The turn-off event of the high-side power transistor 208u causes a voltage transient dV/dt at the phase node terminal 302 (e.g., a voltage transient dV/dt of the phase voltage VS). For example, the turn-off event of the high-side power transistor 208u may cause the phase voltage VS to decrease from the DC-link positive supply DC+ to the DC-link negative supply DC− (e.g., to ground), which causes the second sense voltage LVsense to initially cross the second threshold Th2 on a falling edge and, subsequently, cross the second threshold Th2 on a rising edge. In other words, the voltage transient dV/dt causes a decreasing deviation (e.g., a negative spike) from the steady state value of the second sense voltage LVsense. Once the voltage transient dV/dt is complete, the second sense voltage LVsense returns to the steady state value. Thus, the turn-off event of the high-side power transistor 208u causes two threshold crossings of the second threshold Th2 to be detected by the second adaptive dead time circuit 306, as described above.

The second logic circuit 334 may trigger the low-side transistor 209u to be switched from the off-state to the on-state, thereby ending the current dead time of the low-side transistor 209u, based on the second active-passive discrimination circuit 332 indicating that the voltage transient dV/dt is a passive voltage transient and in response to the second comparison result of the second comparator circuit 330 indicating the second crossing of the second threshold Th2. The second logic circuit 334 may trigger the end of the current dead time by generating the trigger signal ADTtrigger_LS. Based on the trigger signal ADTtrigger_LS, the low-side transistor 209u is turned on.

As indicated above, FIGS. 4A and 4B are provided as an example. Other examples may differ from what is described with regard to FIGS. 4A and 4B.

Figure 5:
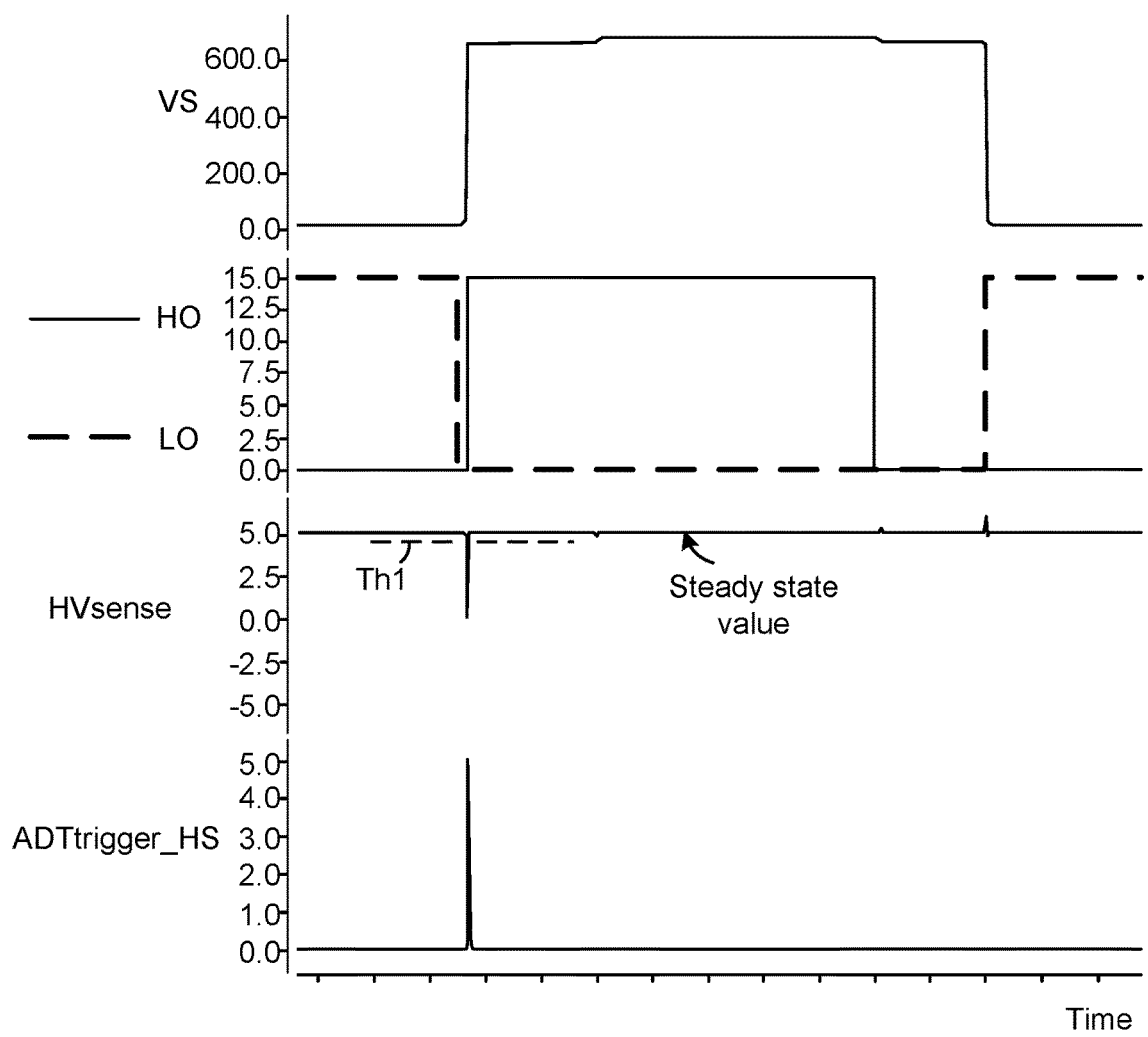
FIG. 5 illustrates a signal diagram corresponding to an adaptive dead time for a high-side power switch according to one or more implementations.

FIG. 5 illustrates a signal diagram 500 corresponding to an adaptive dead time for a high-side power switch according to one or more implementations. The adaptive dead time may be a delay between a turn-off event of the low-side power transistor 209u and a turn-on event of the high-side power transistor 208u.

The turn-off event of the low-side power transistor 209u causes a voltage transient dV/dt at the phase node terminal 302 (e.g., a voltage transient dV/dt of the phase voltage VS). For example, the turn-off event of the low-side power transistor 209u may cause the phase voltage VS to increase from the DC-link negative supply DC− to the DC-link positive supply DC+, which causes the first sense voltage HVsense to initially cross the first threshold Th1 on a falling edge and, subsequently, cross the first threshold Th1 on a rising edge. In other words, the voltage transient dV/dt causes a decreasing deviation (e.g., a negative spike) from the steady state value of the first sense voltage HVsense. Once the voltage transient dV/dt is complete, the first sense voltage HVsense returns to the steady state value. Thus, the turn-off event of the low-side power transistor 209u causes two threshold crossings of the first threshold Th1 detectable by the first adaptive dead time circuit 304, as described above.

The first logic circuit 322 may trigger the high-side transistor 208u to be switched from the off-state to the on-state, thereby ending the current dead time of the high-side transistor 208u, based on the first active-passive discrimination circuit 320 indicating that the voltage transient dV/dt is a passive voltage transient and in response to the first comparison result of the first comparator circuit 318 indicating the second crossing of the first threshold Th1. The first logic circuit 322 may trigger the end of the current dead time by generating the trigger signal ADTtrigger_HS. Based on the trigger signal ADTtrigger_HS, the high-side transistor 208u is turned on.

As indicated above, FIG. 5 is provided as an example. Other examples may differ from what is described with regard to FIG. 5.

Figure 6:
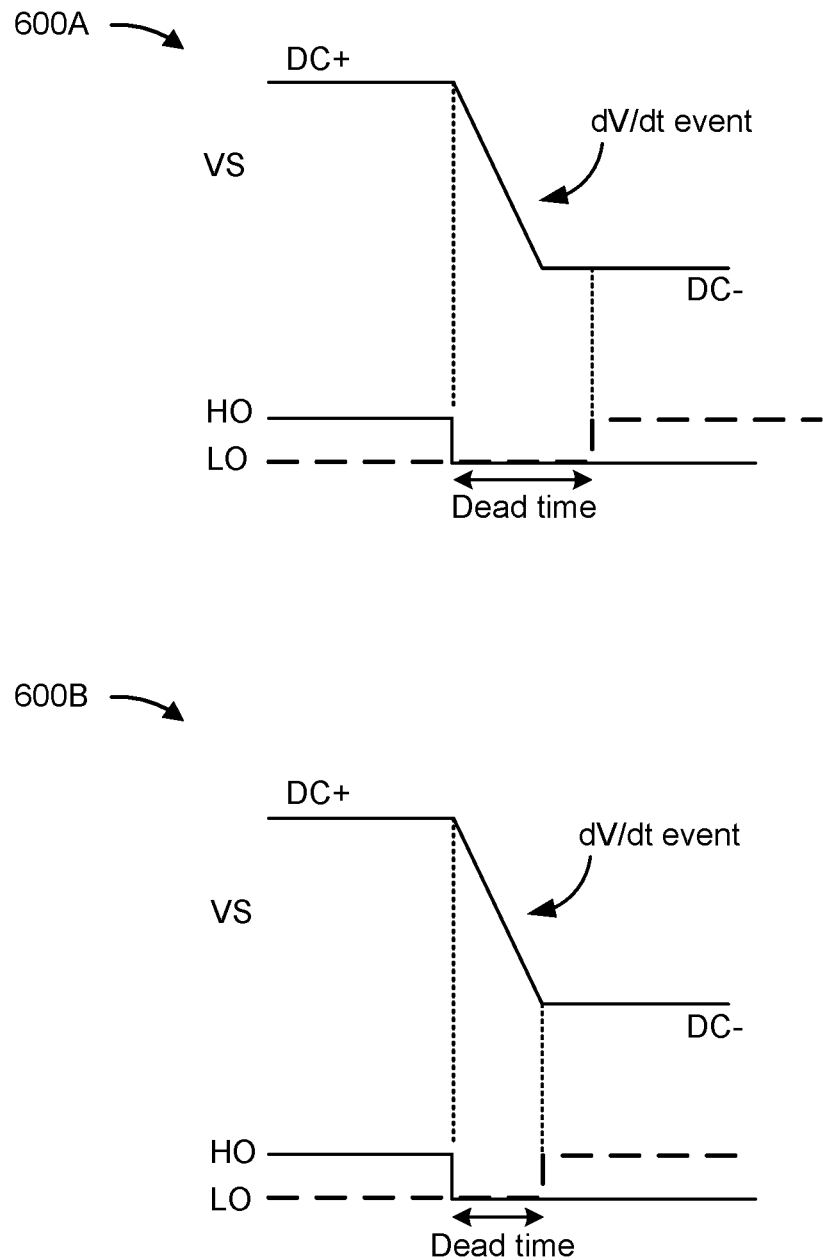
FIG. 6 illustrates signal diagrams corresponding to a dV/dt event that corresponds to a turn-off of a high-side power switch according to one or more implementations.

FIG. 6 illustrates signal diagrams 600A and 600B corresponding to a dV/dt event that corresponds to a turn-off of a high-side power switch according to one or more implementations. Signal diagram 600A shows a non-adaptive or fixed dead time, whereas as signal diagram 600B shows an adaptive dead time. A duration of the adaptive dead time is shorter than a duration of the non-adaptive dead time, resulting in smaller reverse conduction losses for a system that implements the adaptive dead time.

As indicated above, FIG. 6 is provided as an example. Other examples may differ from what is described with regard to FIG. 6.

Figure 7:
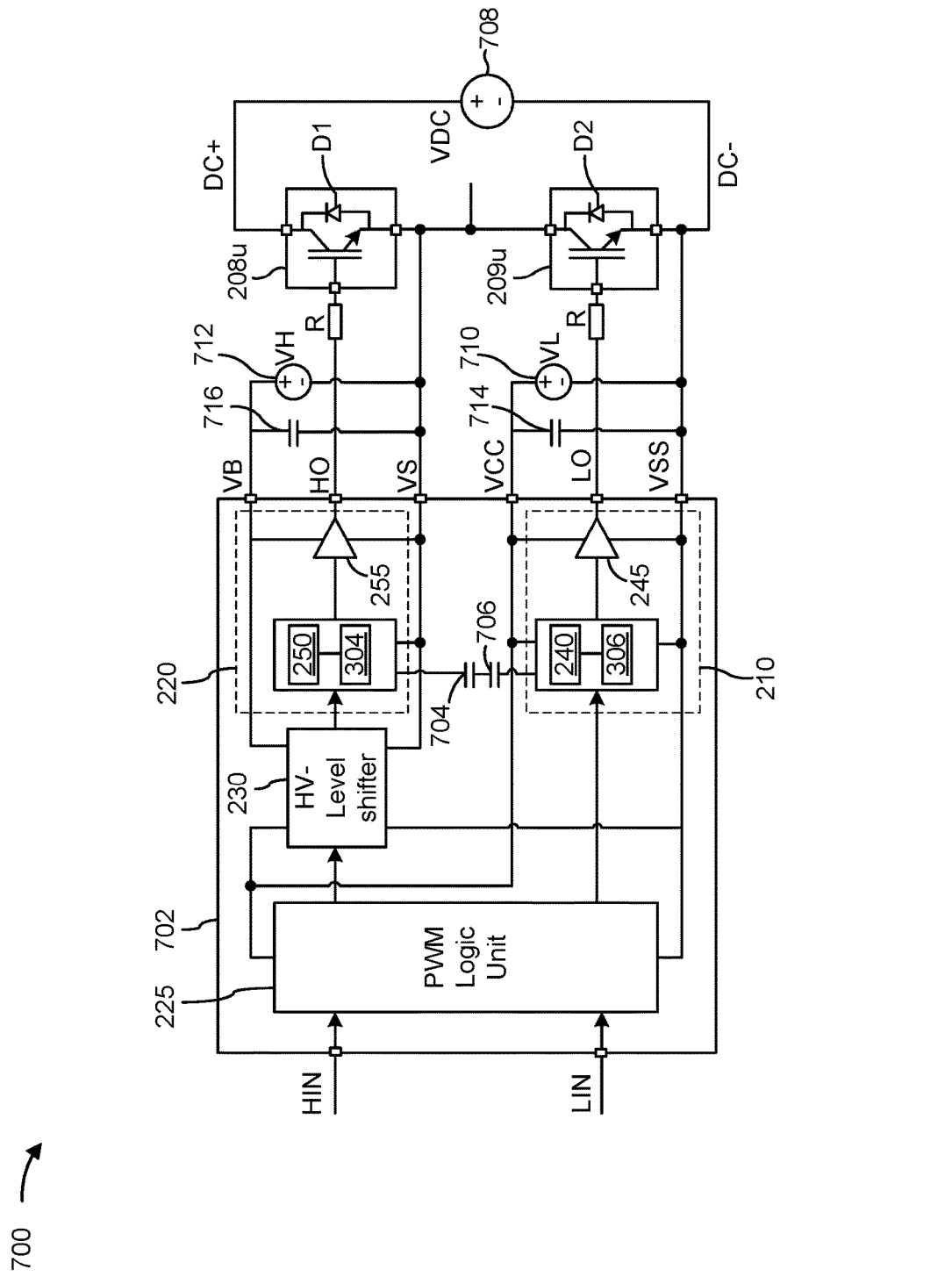
FIG. 7 is a schematic block diagram of a dV/dt sensing and gate driving system according to one or more embodiments.

FIG. 7 is a schematic block diagram of a dV/dt sensing and gate driving system 700 according to one or more embodiments. The dV/dt sensing and gate driving system 700 may include a monolithic gate driver IC 702 having two separate voltage islands corresponding to two isolated voltage domains. The dV/dt sensing and gate driving system 700 may be similar to the gate driver system 200 described in connection with FIG. 2, but further includes circuitry configured to monitor voltage transients dV/dt at the phase node terminal and detect short circuit events in more detail. For example, the first adaptive dead time circuit 304 may be provided in the high-side gate driver 220 and the second adaptive dead time circuit 306 may be provided in the low-side gate driver 210. In addition, a sense capacitor 704 may be connected between the first adaptive dead time circuit 304 and the second adaptive dead time circuit 306 such that the sense capacitor 704 is cross-coupled to the high-side region and the low-side region of the monolithic gate driver IC 702. The sense capacitor 704 may correspond to the capacitor HVC of the circuitry 300A described in connection with FIG. 3A or the capacitor HVC of the circuitry 300B described in connection with FIG. 3B. In some implementations, an optional sense capacitor 706 may be arranged in series with the sense capacitor 704. Thus, the monolithic gate driver IC 702 includes at least one sense capacitor 704 and/or 706 that is coupled to an input node of the first adaptive dead time circuit 304 (e.g., the first sense node 308) and to an input node of the second adaptive dead time circuit 306 (e.g., the second sense node 310).

The first adaptive dead time circuit 304 and the second adaptive dead time circuit 306 may be configured to sense voltage transients dV/dt of the phase voltage VS at the phase node terminal 302 for regulating respective adaptive dead times.

In particular, the first adaptive dead time circuit 304 and the second adaptive dead time circuit 306 may use the sense capacitor 704 to sense dV/dt events in an analog way. The threshold crossings can then be used to regulate the respective adaptive dead times.

The dV/dt sensing and gate driving system 700 may further include a DC-link power supply 708 (VDC), a low-side gate driver power supply 710 (VL), a high-side gate driver power supply 712 (VH), a decoupling capacitor 714 (e.g., a bootstrap capacitor) coupled in parallel to the low-side gate driver power supply 710, a decoupling capacitor 716 (e.g., a bootstrap capacitor) coupled in parallel to the high-side gate driver power supply 712, and resistors R that provide a path for current to flow. Voltage VH may be equal to VB-VS, and voltage VL may be equal to VCC-VSS (e.g., VCC-GND).

The monolithic gate driver IC 702 may include the PWM logic unit 225 that includes circuitry that processes signals received from a microcontroller via pins HIN and LIN, and also forwards PWM control signals from the microcontroller to the low-side gate driver 210 and the high-side gate driver 220. The PWM control signal to the high-side gate driver 220 may be passed through the level shifter 230 over an isolation region that isolates the high-side region and the low-side region.

The sense capacitor 704 and the optional sense capacitor 706 are substantially linear such that voltages are proportional to charges stored therein. The sense capacitor 704 and the optional sense capacitor 706 may be placed across the two voltage domains, and may be external to the monolithic gate driver IC 702 or may be integrated therein, to sense a voltage slope of the voltage transient dV/dt.

The sense capacitor 704 may be used by both the first adaptive dead time circuit 304 and the second adaptive dead time circuit 306 to sense dV/dt events for regulating the respective adaptive dead times. The sense capacitor 704 may be arranged in two sensing paths, including a first sensing path and a second sensing path. The first sensing path may include a first end and a second end. The first sensing path may be coupled at the first end to a collector or a drain of the high-side transistor 208u and coupled at the second end to an emitter or a source of the high-side transistor 208u. The first sensing path may enable the sense capacitor 704 to sense a voltage transient of the high-side transistor 208u (e.g., $V_{DS}$ of the high-side transistor 208u) that is proportional to the phase voltage VS.

The first sensing path from the source of high-side transistor 208u to the drain of high-side transistor 208u may include starting at the source of high-side transistor 208u (e.g., at the phase node), continuing through the high-side gate driver power supply 712 or the decoupling capacitor 716 to VB, continuing from VB to the first sense node 308, and continuing through the sense capacitor 704 to the second sense node 310. From the second sense node 310, the first sensing path continues through the low-side gate driver power supply 710 or the decoupling capacitor 714 to VSS, and continues through the DC-link power supply 708 to DC+, which is equivalent to the drain of the high-side transistor 208u.

The second sensing path may include a third end and a fourth end. The third end may be coupled to a collector or a drain of the low-side transistor 209u, and the fourth end may be coupled to an emitter or a source of the low-side transistor 209u. The second sensing path may enable the sense capacitor 704 to sense a voltage transient of the low-side transistor 209u (e.g., $V_{DS}$ of the low-side transistor 209u) that is proportional to the phase voltage VS. The second sensing path from the source of the low-side transistor 209u to the drain of the low-side transistor 209u may include starting at the source of the low-side transistor 209u (DC− or VSS), continuing through the low-side gate driver power supply 710 or the decoupling capacitor 714 to VCC, continuing from VCC to the second sense node 310, and continuing through the sense capacitor 704 to the first sense node 308. From the first sense node 308, the second sensing path continues through the high-side gate driver power supply 712 or the decoupling capacitor 716 to VS, which is equivalent to the drain of the low-side transistor 209u. Thus, the sense capacitor 704 may be indirectly coupled to the collector or the drain and the emitter or the source of the high-side transistor 208u, and may be indirectly coupled to the collector or the drain and the emitter or the source of the low-side transistor 209u.

As indicated above, FIG. 7 is provided as an example. Other examples may differ from what is described with regard to FIG. 7.

Figure 8:
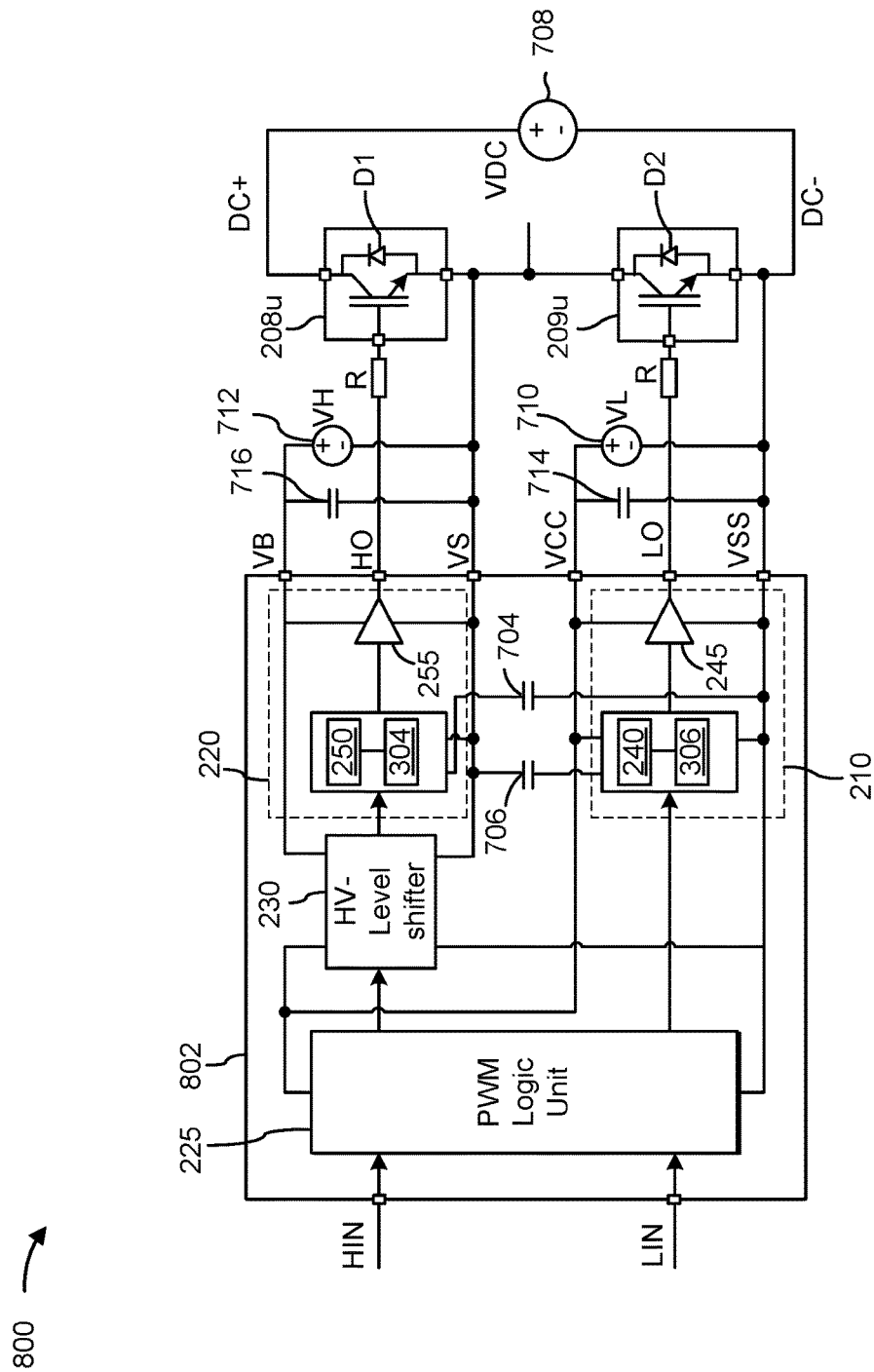
FIG. 8 is a schematic block diagram of a dV/dt sensing and gate driving system according to one or more embodiments.

FIG. 8 is a schematic block diagram of a dV/dt sensing and gate driving system 800 according to one or more embodiments. The dV/dt sensing and gate driving system 800 may include a monolithic gate driver IC 802 having two separate voltage islands corresponding to two isolated voltage domains. The dV/dt sensing and gate driving system 800 may be similar to the dV/dt sensing and gate driving system 700 described in connection with FIG. 7, with the exception that the sense capacitor 704 and the sense capacitor 706 are arranged on different paths. For example, the sense capacitor 704 may correspond to the first adaptive dead time circuit 304 and the sense capacitor 706 may correspond to the second adaptive dead time circuit 306. The sense capacitor 704 may be coupled to an input node of the first adaptive dead time circuit 304 (e.g., the first sense node 308) and to a reference node of the low-side region (e.g., VSS). The sense capacitor 706 may be coupled to an input node of the second adaptive dead time circuit 306 (e.g., the second sense node 310) and to a floating reference node of the high-side region (e.g., VS).

The sense capacitor 704 may be arranged in a first sensing path, and the sense capacitor 706 may be arranged in a second sensing path. The first sensing path may include a first end and a second end. The first sensing path may be coupled at the first end to a collector or a drain of the high-side transistor 208u, and coupled at the second end to an emitter or a source of the high-side transistor 208u. The first sensing path may enable the sense capacitor 704 to sense a voltage transient of the high-side transistor 208u (e.g., $V_{DS}$ of the high-side transistor 208u) that is proportional to the phase voltage VS. The first sensing path from the source of high-side transistor 208u to the drain of high-side transistor 208u may include starting at the source of high-side transistor 208u (e.g., at the phase node), continuing through the high-side gate driver power supply 712 or the decoupling capacitor 716 to VB, continuing from VB to the first sense node 308, continuing through the sense capacitor 704 to VSS, and continuing through the DC-link power supply 708 to DC+, which is equivalent to the drain of the high-side transistor 208u. Thus, the sense capacitor 704 may be indirectly coupled to the collector or the drain and the emitter or the source of the high-side transistor 208u of the high-side transistor 208u.

The second sensing path may include a third end and a fourth end. The third end may be coupled to a collector or a drain of the low-side transistor 209u, and the fourth end may be coupled to an emitter or a source of the low-side transistor 209u. The second sensing path may enable the sense capacitor 706 to sense a voltage transient of the low-side transistor 209u (e.g., $V_{DS}$ of the low-side transistor 209u) that is proportional to the phase voltage VS. The second sensing path from the source of the low-side transistor 209u to the drain of the low-side transistor 209u may include starting at the source of the low-side transistor 209u (DC− or VSS), continuing through the low-side gate driver power supply 710 or the decoupling capacitor 714 to VCC, continuing from VCC to the second sense node 310, continuing through the sense capacitor 706 to VS, which is equivalent to the drain of the low-side transistor 209u. Thus, the sense capacitor 706 may be indirectly coupled to the collector or the drain and the emitter or the source of the low-side transistor 209u.

As indicated above, FIG. 8 is provided as an example. Other examples may differ from what is described with regard to FIG. 8.

The following provides an overview of some Aspects of the present disclosure:

Aspect 1: A gate driver circuit, comprising: a high-side region that operates in a first voltage domain; a low-side region that operates in a second voltage domain lower than the first voltage domain; a gate driver configured to drive a power switch between an on-state and an off-state with an adaptive dead time, wherein the adaptive dead time is a delay between a turn-off event of a complementary power switch and a turn-on event of the power switch, at least one capacitor cross-coupled to the high-side region and the low-side region; a sensing circuit coupled to the at least one capacitor and configured to provide a sense value that is representative of a rate of change of a voltage present at a load terminal of the power switch; a comparator circuit configured to compare the sense value to a threshold, and further configured to generate a comparison result based on whether the sense value satisfies the threshold; a logic circuit configured to receive the comparison result, detect a voltage transient of the voltage based on the comparison result indicating a first crossing of the threshold, and detect an end of the voltage transient based on the comparison result indicating a second crossing of the threshold, wherein the second crossing occurs subsequent to the first crossing and in an opposite direction to the first crossing; and an active-passive discrimination circuit configured to detect a switching state of the power switch, including whether the power switch is in the on-state or in the off-state, wherein the active-passive discrimination circuit is configured to indicate to the logic circuit whether the voltage transient is an active voltage transient or a passive voltage transient based on the switching state of the power switch, and wherein the logic circuit is configured to regulate the adaptive dead time of the power switch based on the comparison result indicating the second crossing of the threshold and based on the voltage transient being the passive voltage transient.

Aspect 2: The gate driver circuit of Aspect 1, wherein the logic circuit is configured to trigger the power switch to be switched from the off-state to the on-state based on the active-passive discrimination circuit indicating that the voltage transient is the passive voltage transient and in response to the comparison result indicating the second crossing of the threshold.

Aspect 3: The gate driver circuit of any of Aspects 1-2, wherein the logic circuit is configured to adjust the adaptive dead time based on detecting the second crossing of the threshold and based on the voltage transient being the passive voltage transient.

Aspect 4: The gate driver circuit of any of Aspects 1-3, wherein the logic circuit is configured to minimize the adaptive dead time based on detecting the second crossing of the threshold and based on the voltage transient being the passive voltage transient.

Aspect 5: The gate driver circuit of any of Aspects 1-4, wherein the active-passive discrimination circuit is configured to receive the comparison result, detect the voltage transient based on the comparison result indicating the first crossing of the threshold, and determine whether the voltage transient, corresponding to the first crossing of the threshold, is the active voltage transient or the passive voltage transient based on the switching state of the power switch.

Aspect 6: The gate driver circuit of Aspect 5, wherein the active-passive discrimination circuit is configured to determine that the voltage transient is the active voltage transient if the power switch is in the on-state at a beginning of the voltage transient, and determine that the voltage transient is the passive voltage transient if the power switch is in the off-state at the beginning of the voltage transient.

Aspect 7: The gate driver circuit of any of Aspects 1-6, wherein the first crossing of the threshold corresponds to a beginning of the voltage transient.

Aspect 8: The gate driver circuit of any of Aspects 1-7, wherein the logic circuit is configured to detect that the voltage transient is occurring based on the comparison result indicating that the sense value satisfies the threshold, wherein a beginning of the voltage transient corresponds to the first crossing of the threshold, and wherein the logic circuit is configured to detect that the voltage transient is not occurring based on the comparison result indicating that the sense value does not satisfy the threshold, wherein the end of the voltage transient corresponds to the second crossing of the threshold.

Aspect 9: The gate driver circuit of any of Aspects 1-8, wherein the sensing circuit is configured to generate the sense value at a steady state value when the voltage is in a steady state, wherein the steady state value is greater than the threshold by a predetermined amount.

Aspect 10: The gate driver circuit of any of Aspects 1-9, wherein the first crossing of the threshold corresponds to a falling edge of the sense value, and wherein the second crossing of the threshold corresponds to a rising edge of the sense value, or wherein the first crossing of the threshold corresponds to a rising edge of the sense value, and wherein the second crossing of the threshold corresponds to a falling edge of the sense value.

Aspect 11: The gate driver circuit of any of Aspects 1-10, wherein turning off a complementary power switch coupled to the load terminal is configured to induce the voltage transient and cause the sense value to satisfy the threshold by causing the sense value to be less than the threshold, or wherein turning off a complementary power switch coupled to the load terminal is configured to induce the voltage transient and cause the sense value to satisfy the threshold by causing the sense value to be greater than the threshold.

Aspect 12: The gate driver circuit of any of Aspects 1-11, wherein the gate driver is configured to be coupled to an internal positive supply voltage and an internal ground voltage, wherein the gate driver is configured to use the internal positive supply voltage and the internal ground voltage to drive the power switch between the on-state and the off-state, and wherein the threshold is less than the internal positive supply voltage.

Aspect 13: The gate driver circuit of any of Aspects 1-12, wherein the at least one capacitor is configured to sense the voltage transient and provide a capacitor current proportional to a slope of the voltage transient, and wherein the capacitor current is configured to generate the sense value at a sense node of the sensing circuit.

Aspect 14: The gate driver circuit of Aspect 13, wherein the voltage transient corresponds to a voltage across the power switch, wherein the voltage across the power switch is a drain-source voltage or a collector-emitter voltage, and wherein the capacitor current is based on a rate of change of the voltage across the power switch.

Aspect 15: The gate driver circuit of any of Aspects 1-14, wherein: the power switch is a high-side power switch, the gate driver and the sensing circuit are disposed in the high-side region, and the at least one capacitor is coupled to an input node of the sensing circuit and to a reference node of the low-side region.

Aspect 16: The gate driver circuit of any of Aspects 1-15, further comprising: a sensing path comprising a first end and a second end, wherein the sensing path is coupled at the first end to a collector or a drain of the power switch and coupled at the second end to an emitter or a source of the power switch, and wherein the at least one capacitor is arranged in the sensing path.

Aspect 17: The gate driver circuit of any of Aspects 1-16, wherein: the power switch is a low-side power switch, the gate driver and the sensing circuit are disposed in the low-side region, and the at least one capacitor is coupled to an input node of the sensing circuit and to a floating reference node of the high-side region.

Aspect 18: A half-bridge gate driver circuit, comprising: a high-side region that operates in a first voltage domain; a low-side region that operates in a second voltage domain lower than the first voltage domain; a first gate driver arranged in the high-side region and configured to drive a high-side power switch between an on-state and an off-state with a first adaptive dead time provided during an off-state interval of the high-side power switch; a second gate driver arranged in the low-side region and configured to drive a low-side power switch between the on-state and the off-state with a second adaptive dead time provided during an off-state interval of the low-side power switch, wherein the first adaptive dead time is a delay between a turn-off event of the low-side power switch and a turn-on event of the high-side power switch, wherein the second adaptive dead time is a delay between a turn-off event of the high-side power switch and a turn-on event of the low-side power switch; a phase node terminal coupled to or configured to be coupled to a phase node to which the high-side power switch and the low-side power switch are coupled; at least one capacitor cross-coupled to the high-side region and the low-side region; a first sensing circuit arranged in the high-side region, wherein the first sensing circuit is coupled to a first corresponding capacitor of the at least one capacitor, and configured to provide a first sense value representative of a rate of change of a phase voltage present at the phase node terminal; a second sensing circuit arranged in the low-side region, wherein the second sensing circuit is coupled to a second corresponding capacitor of the at least one capacitor, and configured to provide a second sense value representative of the rate of change of the phase voltage present at the phase node terminal; a first comparator circuit configured to compare the first sense value to a first threshold, and further configured to generate a first comparison result based on whether the first sense value satisfies the first threshold; a second comparator circuit configured to compare the second sense value to a second threshold, and further configured to generate a second comparison result based on whether the second sense value satisfies the second threshold; a first logic circuit configured to receive the first comparison result, detect a first voltage transient of the phase node terminal based on the first comparison result indicating a first crossing of the first threshold, and detect an end of the first voltage transient based on the first comparison result indicating a second crossing of the first threshold, wherein the second crossing of the first threshold occurs subsequent to the first crossing of the first threshold and in an opposite direction to the first crossing of the first threshold; a first active-passive discrimination circuit configured to detect a first switching state of the high-side power switch, including whether the high-side power switch is in the on-state or in the off-state, wherein the first active-passive discrimination circuit is configured to indicate to the first logic circuit whether the first voltage transient is an active voltage transient or a passive voltage transient based the first switching state of the high-side power switch, and wherein the first logic circuit is configured to regulate the first adaptive dead time of the high-side power switch based on the first comparison result indicating the second crossing of the first threshold and based on the first voltage transient being the passive voltage transient; a second logic circuit configured to receive the second comparison result, detect a second voltage transient of the phase node terminal based on the second comparison result indicating a first crossing of the second threshold, and detect an end of the second voltage transient based on the second comparison result indicating a second crossing of the second threshold, wherein the second crossing of the second threshold occurs subsequent to the first crossing of the second threshold and in an opposite direction to the first crossing of the second threshold; and a second active-passive discrimination circuit configured to detect a second switching state of the low-side power switch, including whether the low-side power switch is in the on-state or whether the low-side power switch is in the off-state, wherein the second active-passive discrimination circuit is configured to indicate to the second logic circuit whether the second voltage transient is an active voltage transient or a passive voltage transient based the second switching state of the low-side power switch, wherein the second logic circuit is configured to regulate the second adaptive dead time of the low-side power switch based on the second comparison result indicating the second crossing of the second threshold and based on second voltage transient being the passive voltage transient, and wherein the first corresponding capacitor and the second corresponding capacitor are a same capacitor or are different capacitors.

Aspect 19: The half-bridge gate driver circuit of Aspect 18, wherein turning off the high-side power switch is configured to induce the second voltage transient and cause the second sense value to satisfy the second threshold by causing the second sense value to be less than the second threshold, and wherein turning off the low-side power switch is configured to induce the first voltage transient and cause the first sense value to satisfy the first threshold by causing the first sense value to be less than the first threshold.

Aspect 20: A method of regulating an adaptive dead time, comprising: generating, by a gate driver of a gate driver circuit, a driving signal configured to drive a power switch between an on-state and an off-state; sensing, by a capacitor, a voltage transient of a voltage across the power switch, wherein the capacitor is cross-coupled to a high-side region and a low-side region of the gate driver circuit such that the capacitor is configured to provide a capacitor current proportional to a slope of the voltage transient; producing, at a sense node coupled to the capacitor, a sense value based on the capacitor current, wherein the sense value is proportional to the slope of the voltage transient; comparing, by a comparator circuit, the sense value to a threshold to generate a comparison result that indicates whether or not the sense value satisfies the threshold; detecting, by a logic circuit, the voltage transient based on the comparison result indicating a first crossing of the threshold; detecting, by the logic circuit, an end of the voltage transient based on the comparison result indicating a second crossing of the threshold, wherein the second crossing occurs subsequent to the first crossing and in an opposite direction to the first crossing; generating, by an active-passive discrimination circuit, a status signal indicating whether the voltage transient is an active voltage transient or a passive voltage transient based on a switching state of the power switch; and regulating, by the logic circuit, the adaptive dead time of the power switch based on the comparison result indicating the second crossing of the threshold and based on the voltage transient being the passive voltage transient.

Aspect 21: A gate driver circuit, comprising: a high-side region that operates in a first voltage domain; a low-side region that operates in a second voltage domain lower than the first voltage domain; a gate driver configured to drive a power switch between an on-state and an off-state with an adaptive dead time, wherein the adaptive dead time is a delay between a turn-off event of a complementary power switch and a turn-on event of the power switch; at least one capacitor cross-coupled to the high-side region and the low-side region such that the at least one capacitor is configured to sense a voltage transient of a voltage across the power switch and provide a capacitor current proportional to a slope of the voltage transient; a sensing circuit configured to receive the capacitor current and provide a sense value corresponding to the capacitor current; a comparator circuit configured to compare the sense value to a threshold, and further configured to generate a comparison result based on whether the sense value satisfies the threshold; a logic circuit configured to receive the comparison result, detect the voltage transient based on the comparison result indicating a first crossing of the threshold, and detect an end of the voltage transient based on the comparison result indicating a second crossing of the threshold, wherein the second crossing occurs subsequent to the first crossing and in an opposite direction to the first crossing; and an active-passive discrimination circuit configured to detect a switching state of the power switch, including whether the power switch is in the on-state or whether the power switch is in the off-state, wherein the active-passive discrimination circuit is configured to indicate to the logic circuit whether the voltage transient is an active voltage transient or a passive voltage transient based on the switching state of the power switch, and wherein the logic circuit is configured to regulate the adaptive dead time of the power switch based on the comparison result indicating the second crossing of the threshold and based on the voltage transient being the passive voltage transient.

Aspect 22: A power module, comprising: a high-side region that operates in a first voltage domain; a high-side power switch coupled to the high-side region, wherein the high-side power switch comprises a first control terminal; a low-side region that operates in a second voltage domain lower than the first voltage domain; a low-side power switch coupled to the low-side region, wherein the low-side power switch comprises a second control terminal; a first gate driver arranged in the high-side region and coupled to the first control terminal, wherein the first gate driver is configured to drive the high-side power switch between an on-state and an off-state with a first adaptive dead time provided during an off-state interval of the high-side power switch; a second gate driver arranged in the low-side region and coupled to the second control terminal, wherein the second gate driver is configured to drive the low-side power switch between the on-state and the off-state with a second adaptive dead time provided during an off-state interval of the low-side power switch, wherein the first adaptive dead time is a delay between a turn-off event of the low-side power switch and a turn-on event of the high-side power switch, wherein the second adaptive dead time is a delay between a turn-off event of the high-side power switch and a turn-on event of the low-side power switch; a phase node terminal coupled to or configured to be coupled to a phase node to which the high-side power switch and the low-side power switch are coupled; at least one capacitor cross-coupled to the high-side region and the low-side region; a first sensing circuit arranged in the high-side region, wherein the first sensing circuit is coupled to a first corresponding capacitor of the at least one capacitor, and configured to provide a first sense value representative of a rate of change of a phase voltage present at the phase node terminal; a second sensing circuit arranged in the low-side region, wherein the second sensing circuit is coupled to a second corresponding capacitor of the at least one capacitor, and configured to provide a second sense value representative of the rate of change of the phase voltage present at the phase node terminal; a first comparator circuit configured to compare the first sense value to a first threshold, and further configured to generate a first comparison result based on whether the first sense value satisfies the first threshold; a second comparator circuit configured to compare the second sense value to a second threshold, and further configured to generate a second comparison result based on whether the second sense value satisfies the second threshold; a first logic circuit configured to receive the first comparison result, detect a first voltage transient of the phase node terminal based on the first comparison result indicating a first crossing of the first threshold, and detect an end of the first voltage transient based on the first comparison result indicating a second crossing of the first threshold, wherein the second crossing of the first threshold occurs subsequent to the first crossing of the first threshold and in an opposite direction to the first crossing of the first threshold; a first active-passive discrimination circuit configured to detect a first switching state of the high-side power switch, including whether the high-side power switch is in the on-state or in the off-state, wherein the first active-passive discrimination circuit is configured to indicate to the first logic circuit whether the first voltage transient is an active voltage transient or a passive voltage transient based the first switching state of the high-side power switch, and wherein the first logic circuit is configured to regulate the first adaptive dead time of the high-side power switch based on the first comparison result indicating the second crossing of the first threshold and based on the first voltage transient being the passive voltage transient; a second logic circuit configured to receive the second comparison result, detect a second voltage transient of the phase node terminal based on the second comparison result indicating a first crossing of the second threshold, and detect an end of the second voltage transient based on the second comparison result indicating a second crossing of the second threshold, wherein the second crossing of the second threshold occurs subsequent to the first crossing of the second threshold and in an opposite direction to the first crossing of the second threshold; and a second active-passive discrimination circuit configured to detect a second switching state of the low-side power switch, including whether the low-side power switch is in the on-state or whether the low-side power switch is in the off-state, wherein the second active-passive discrimination circuit is configured to indicate to the second logic circuit whether the second voltage transient is an active voltage transient or a passive voltage transient based the second switching state of the low-side power switch, wherein the second logic circuit is configured to regulate the second adaptive dead time of the low-side power switch based on the second comparison result indicating the second crossing of the second threshold and based on second voltage transient being the passive voltage transient, and wherein the first corresponding capacitor and the second corresponding capacitor are a same capacitor or are different capacitors.

Aspect 23: A gate driver circuit, comprising: a high-side region that operates in a first voltage domain; a low-side region that operates in a second voltage domain lower than the first voltage domain; a gate driver configured to drive a power switch between an on-state and an off-state with an adaptive dead time, wherein the adaptive dead time is a delay between a turn-off event of a complementary power switch and a turn-on event of the power switch, at least one capacitor cross-coupled to the high-side region and the low-side region; a sensing circuit coupled to the at least one capacitor and configured to provide a sense value that is representative of a rate of change of a voltage present at a load terminal of the power switch; a comparator circuit configured to compare the sense value to a threshold, and further configured to generate a comparison result based on whether the sense value satisfies the threshold, wherein the comparison result indicates a presence of a voltage transient of the voltage corresponding to a first crossing of the threshold, and indicates an end of the voltage transient with a second crossing of the threshold, and wherein the second crossing occurs subsequent to the first crossing and in an opposite direction to the first crossing; a logic circuit configured to process the comparison result; and an active-passive discrimination circuit configured to detect a switching state of the power switch, including whether the power switch is in the on-state or in the off-state, wherein the active-passive discrimination circuit is configured to indicate to the logic circuit whether the voltage transient is an active voltage transient or a passive voltage transient based on the switching state of the power switch, and wherein the logic circuit is configured to regulate the adaptive dead time of the power switch based on the comparison result indicating the second crossing of the threshold and based on the voltage transient being the passive voltage transient.

Aspect 24: A system configured to perform one or more operations recited in one or more of Aspects 1-23.

Aspect 25: An apparatus comprising means for performing one or more operations recited in one or more of Aspects 1-23.

Aspect 26: A non-transitory computer-readable medium storing a set of instructions, the set of instructions comprising one or more instructions that, when executed by a device, cause the device to perform one or more operations recited in one or more of Aspects 1-23.

Aspect 27: A computer program product comprising instructions or code for executing one or more operations recited in one or more of Aspects 1-23.

The foregoing disclosure provides illustration and description, but is not intended to be exhaustive or to limit the implementations to the precise form disclosed. Modifications and variations may be made in light of the above disclosure or may be acquired from practice of the implementations.

Some implementations may be described herein in connection with thresholds. As used herein, "satisfying" a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term "component" is intended to be broadly construed as hardware, firmware, or a combination of hardware and software. Systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein, refers to any of the foregoing structures or any other structure suitable for implementation of the techniques described herein. Software may be stored on a non-transitory computer-readable medium such that the non-transitory computer readable medium includes program code or a program algorithm stored thereon that, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal, further information. "Signal conditioning," as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a and b, a and c, b and c, a, b, and c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A gate driver circuit, comprising:
   a high-side region that operates in a first voltage domain;
   a low-side region that operates in a second voltage domain lower than the first voltage domain;
   a gate driver configured to drive a power switch between an on-state and an off-state with an adaptive dead time, wherein the adaptive dead time is a delay between a turn-off event of a complementary power switch and a turn-on event of the power switch,
   at least one capacitor cross-coupled to the high-side region and the low-side region;
   a sensing circuit coupled to the at least one capacitor and configured to provide a sense value that is representative of a rate of change of a voltage present at a load terminal of the power switch;
   a comparator circuit configured to compare the sense value to a threshold, and further configured to generate a comparison result based on whether the sense value satisfies the threshold;
   a logic circuit configured to receive the comparison result, detect a voltage transient of the voltage based on the comparison result indicating a first crossing of the threshold, and detect an end of the voltage transient based on the comparison result indicating a second crossing of the threshold, wherein the second crossing occurs subsequent to the first crossing and in an opposite direction to the first crossing; and
   an active-passive discrimination circuit configured to detect a switching state of the power switch, including whether the power switch is in the on-state or in the off-state,
   wherein the active-passive discrimination circuit is configured to indicate to the logic circuit whether the voltage transient is an active voltage transient or a passive voltage transient based on the switching state of the power switch, and
   wherein the logic circuit is configured to regulate the adaptive dead time of the power switch based on the comparison result indicating the second crossing of the threshold and based on the voltage transient being the passive voltage transient.

2. The gate driver circuit of claim 1, wherein the logic circuit is configured to trigger the power switch to be switched from the off-state to the on-state based on the active-passive discrimination circuit indicating that the voltage transient is the passive voltage transient and in response to the comparison result indicating the second crossing of the threshold.

3. The gate driver circuit of claim 1, wherein the logic circuit is configured to adjust the adaptive dead time based on detecting the second crossing of the threshold and based on the voltage transient being the passive voltage transient.

4. The gate driver circuit of claim 1, wherein the logic circuit is configured to minimize the adaptive dead time based on detecting the second crossing of the threshold and based on the voltage transient being the passive voltage transient.

5. The gate driver circuit of claim 1, wherein the active-passive discrimination circuit is configured to receive the comparison result, detect the voltage transient based on the comparison result indicating the first crossing of the threshold, and determine whether the voltage transient, corresponding to the first crossing of the threshold, is the active voltage transient or the passive voltage transient based on the switching state of the power switch.

6. The gate driver circuit of claim 5, wherein the active-passive discrimination circuit is configured to determine that the voltage transient is the active voltage transient if the power switch is in the on-state at a beginning of the voltage transient, and determine that the voltage transient is the passive voltage transient if the power switch is in the off-state at the beginning of the voltage transient.

7. The gate driver circuit of claim 1, wherein the first crossing of the threshold corresponds to a beginning of the voltage transient.

8. The gate driver circuit of claim 1, wherein the logic circuit is configured to detect that the voltage transient is occurring based on the comparison result indicating that the sense value satisfies the threshold, wherein a beginning of the voltage transient corresponds to the first crossing of the threshold, and wherein the logic circuit is configured to detect that the voltage transient is not occurring based on the comparison result indicating that the sense value does not satisfy the threshold, wherein the end of the voltage transient corresponds to the second crossing of the threshold.

9. The gate driver circuit of claim 1, wherein the sensing circuit is configured to generate the sense value at a steady state value when the voltage is in a steady state, wherein the steady state value is greater than the threshold by a predetermined amount.

10. The gate driver circuit of claim 1, wherein the first crossing of the threshold corresponds to a falling edge of the sense value, and wherein the second crossing of the threshold corresponds to a rising edge of the sense value, or wherein the first crossing of the threshold corresponds to a rising edge of the sense value, and wherein the second crossing of the threshold corresponds to a falling edge of the sense value.

11. The gate driver circuit of claim 1, wherein turning off a complementary power switch coupled to the load terminal is configured to induce the voltage transient and cause the sense value to satisfy the threshold by causing the sense value to be less than the threshold, or wherein turning off a complementary power switch coupled to the load terminal is configured to induce the voltage transient and cause the sense value to satisfy the threshold by causing the sense value to be greater than the threshold.

12. The gate driver circuit of claim 1, wherein the gate driver is configured to be coupled to an internal positive supply voltage and an internal ground voltage, wherein the gate driver is configured to use the internal positive supply voltage and the internal ground voltage to drive the power switch between the on-state and the off-state, and wherein the threshold is less than the internal positive supply voltage.

13. The gate driver circuit of claim 1, wherein the at least one capacitor is configured to sense the voltage transient and provide a capacitor current proportional to a slope of the voltage transient, and wherein the capacitor current is configured to generate the sense value at a sense node of the sensing circuit.

14. The gate driver circuit of claim 13, wherein the voltage transient corresponds to a voltage across the power switch, wherein the voltage across the power switch is a drain-source voltage or a collector-emitter voltage, and wherein the capacitor current is based on a rate of change of the voltage across the power switch.

15. The gate driver circuit of claim 1, wherein:
the power switch is a high-side power switch,
the gate driver and the sensing circuit are disposed in the high-side region, and
the at least one capacitor is coupled to an input node of the sensing circuit and to a reference node of the low-side region.

16. The gate driver circuit of claim 1, further comprising:
a sensing path comprising a first end and a second end, wherein the sensing path is coupled at the first end to a collector or a drain of the power switch and coupled at the second end to an emitter or a source of the power switch, and wherein the at least one capacitor is arranged in the sensing path.

17. The gate driver circuit of claim 1, wherein:
the power switch is a low-side power switch,
the gate driver and the sensing circuit are disposed in the low-side region, and
the at least one capacitor is coupled to an input node of the sensing circuit and to a floating reference node of the high-side region.

18. A half-bridge gate driver circuit, comprising:
a high-side region that operates in a first voltage domain;
a low-side region that operates in a second voltage domain lower than the first voltage domain;
a first gate driver arranged in the high-side region and configured to drive a high-side power switch between an on-state and an off-state with a first adaptive dead time provided during an off-state interval of the high-side power switch;
a second gate driver arranged in the low-side region and configured to drive a low-side power switch between the on-state and the off-state with a second adaptive dead time provided during an off-state interval of the low-side power switch,
wherein the first adaptive dead time is a delay between a turn-off event of the low-side power switch and a turn-on event of the high-side power switch,
wherein the second adaptive dead time is a delay between a turn-off event of the high-side power switch and a turn-on event of the low-side power switch;
a phase node terminal coupled to or configured to be coupled to a phase node to which the high-side power switch and the low-side power switch are coupled;
at least one capacitor cross-coupled to the high-side region and the low-side region;
a first sensing circuit arranged in the high-side region, wherein the first sensing circuit is coupled to a first corresponding capacitor of the at least one capacitor, and configured to provide a first sense value representative of a rate of change of a phase voltage present at the phase node terminal;

a second sensing circuit arranged in the low-side region, wherein the second sensing circuit is coupled to a second corresponding capacitor of the at least one capacitor, and configured to provide a second sense value representative of the rate of change of the phase voltage present at the phase node terminal;

a first comparator circuit configured to compare the first sense value to a first threshold, and further configured to generate a first comparison result based on whether the first sense value satisfies the first threshold;

a second comparator circuit configured to compare the second sense value to a second threshold, and further configured to generate a second comparison result based on whether the second sense value satisfies the second threshold;

a first logic circuit configured to receive the first comparison result, detect a first voltage transient of the phase node terminal based on the first comparison result indicating a first crossing of the first threshold, and detect an end of the first voltage transient based on the first comparison result indicating a second crossing of the first threshold, wherein the second crossing of the first threshold occurs subsequent to the first crossing of the first threshold and in an opposite direction to the first crossing of the first threshold;

a first active-passive discrimination circuit configured to detect a first switching state of the high-side power switch, including whether the high-side power switch is in the on-state or in the off-state, wherein the first active-passive discrimination circuit is configured to indicate to the first logic circuit whether the first voltage transient is an active voltage transient or a passive voltage transient based the first switching state of the high-side power switch, and wherein the first logic circuit is configured to regulate the first adaptive dead time of the high-side power switch based on the first comparison result indicating the second crossing of the first threshold and based on the first voltage transient being the passive voltage transient;

a second logic circuit configured to receive the second comparison result, detect a second voltage transient of the phase node terminal based on the second comparison result indicating a first crossing of the second threshold, and detect an end of the second voltage transient based on the second comparison result indicating a second crossing of the second threshold, wherein the second crossing of the second threshold occurs subsequent to the first crossing of the second threshold and in an opposite direction to the first crossing of the second threshold; and a second active-passive discrimination circuit configured to detect a second switching state of the low-side power switch, including whether the low-side power switch is in the on-state or whether the low-side power switch is in the off-state, wherein the second active-passive discrimination circuit is configured to indicate to the second logic circuit whether the second voltage transient is an active voltage transient or a passive voltage transient based the second switching state of the low-side power switch, wherein the second logic circuit is configured to regulate the second adaptive dead time of the low-side power switch based on the second comparison result indicating the second crossing of the second threshold and based on second voltage transient being the passive voltage transient, and wherein the first corresponding capacitor and the second corresponding capacitor are a same capacitor or are different capacitors.

19. The half-bridge gate driver circuit of claim 18, wherein turning off the high-side power switch is configured to induce the second voltage transient and cause the second sense value to satisfy the second threshold by causing the second sense value to be less than the second threshold, and wherein turning off the low-side power switch is configured to induce the first voltage transient and cause the first sense value to satisfy the first threshold by causing the first sense value to be less than the first threshold.

20. A method of regulating an adaptive dead time, comprising:

generating, by a gate driver of a gate driver circuit, a driving signal configured to drive a power switch between an on-state and an off-state;

sensing, by a capacitor, a voltage transient of a voltage across the power switch, wherein the capacitor is cross-coupled to a high-side region and a low-side region of the gate driver circuit such that the capacitor is configured to provide a capacitor current proportional to a slope of the voltage transient;

producing, at a sense node coupled to the capacitor, a sense value based on the capacitor current, wherein the sense value is proportional to the slope of the voltage transient;

comparing, by a comparator circuit, the sense value to a threshold to generate a comparison result that indicates whether or not the sense value satisfies the threshold;

detecting, by a logic circuit, the voltage transient based on the comparison result indicating a first crossing of the threshold;

detecting, by the logic circuit, an end of the voltage transient based on the comparison result indicating a second crossing of the threshold, wherein the second crossing occurs subsequent to the first crossing and in an opposite direction to the first crossing;

generating, by an active-passive discrimination circuit, a status signal indicating whether the voltage transient is an active voltage transient or a passive voltage transient based on a switching state of the power switch; and regulating, by the logic circuit, the adaptive dead time of the power switch based on the comparison result indicating the second crossing of the threshold and based on the voltage transient being the passive voltage transient.

21. A power module, comprising:

a high-side region that operates in a first voltage domain;

a high-side power switch coupled to the high-side region, wherein the high-side power switch comprises a first control terminal;

a low-side region that operates in a second voltage domain lower than the first voltage domain;

a low-side power switch coupled to the low-side region, wherein the low-side power switch comprises a second control terminal;

a first gate driver arranged in the high-side region and coupled to the first control terminal, wherein the first gate driver is configured to drive the high-side power switch between an on-state and an off-state with a first adaptive dead time provided during an off-state interval of the high-side power switch;

a second gate driver arranged in the low-side region and coupled to the second control terminal, wherein the second gate driver is configured to drive the low-side power switch between the on-state and the off-state with a second adaptive dead time provided during an off-state interval of the low-side power switch,
wherein the first adaptive dead time is a delay between a turn-off event of the low-side power switch and a turn-on event of the high-side power switch,
wherein the second adaptive dead time is a delay between a turn-off event of the high-side power switch and a turn-on event of the low-side power switch;
a phase node terminal coupled to or configured to be coupled to a phase node to which the high-side power switch and the low-side power switch are coupled;
at least one capacitor cross-coupled to the high-side region and the low-side region;
a first sensing circuit arranged in the high-side region, wherein the first sensing circuit is coupled to a first corresponding capacitor of the at least one capacitor, and configured to provide a first sense value representative of a rate of change of a phase voltage present at the phase node terminal;
a second sensing circuit arranged in the low-side region, wherein the second sensing circuit is coupled to a second corresponding capacitor of the at least one capacitor, and configured to provide a second sense value representative of the rate of change of the phase voltage present at the phase node terminal;
a first comparator circuit configured to compare the first sense value to a first threshold, and further configured to generate a first comparison result based on whether the first sense value satisfies the first threshold;
a second comparator circuit configured to compare the second sense value to a second threshold, and further configured to generate a second comparison result based on whether the second sense value satisfies the second threshold;
a first logic circuit configured to receive the first comparison result, detect a first voltage transient of the phase node terminal based on the first comparison result indicating a first crossing of the first threshold, and detect an end of the first voltage transient based on the first comparison result indicating a second crossing of the first threshold, wherein the second crossing of the first threshold occurs subsequent to the first crossing of the first threshold and in an opposite direction to the first crossing of the first threshold;

a first active-passive discrimination circuit configured to detect a first switching state of the high-side power switch, including whether the high-side power switch is in the on-state or in the off-state,
wherein the first active-passive discrimination circuit is configured to indicate to the first logic circuit whether the first voltage transient is an active voltage transient or a passive voltage transient based the first switching state of the high-side power switch, and
wherein the first logic circuit is configured to regulate the first adaptive dead time of the high-side power switch based on the first comparison result indicating the second crossing of the first threshold and based on the first voltage transient being the passive voltage transient;
a second logic circuit configured to receive the second comparison result, detect a second voltage transient of the phase node terminal based on the second comparison result indicating a first crossing of the second threshold, and detect an end of the second voltage transient based on the second comparison result indicating a second crossing of the second threshold, wherein the second crossing of the second threshold occurs subsequent to the first crossing of the second threshold and in an opposite direction to the first crossing of the second threshold; and
a second active-passive discrimination circuit configured to detect a second switching state of the low-side power switch, including whether the low-side power switch is in the on-state or whether the low-side power switch is in the off-state,
wherein the second active-passive discrimination circuit is configured to indicate to the second logic circuit whether the second voltage transient is an active voltage transient or a passive voltage transient based the second switching state of the low-side power switch,
wherein the second logic circuit is configured to regulate the second adaptive dead time of the low-side power switch based on the second comparison result indicating the second crossing of the second threshold and based on second voltage transient being the passive voltage transient, and
wherein the first corresponding capacitor and the second corresponding capacitor are a same capacitor or are different capacitors.

\* \* \* \* \*